United States Patent
Patel et al.

(10) Patent No.: US 11,029,475 B2
(45) Date of Patent: Jun. 8, 2021

(54) FRAME LID FOR IN-PACKAGE OPTICS

(71) Applicant: Cisco Technology, Inc., San Jose, CA (US)

(72) Inventors: Vipulkumar K. Patel, Breinigsville, PA (US); Aparna R. Prasad, San Jose, CA (US); Sandeep Razdan, Burlingame, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/522,531

(22) Filed: Jul. 25, 2019

(65) Prior Publication Data

US 2020/0319416 A1 Oct. 8, 2020

Related U.S. Application Data

(60) Provisional application No. 62/831,093, filed on Apr. 8, 2019.

(51) Int. Cl.
*G02B 6/42* (2006.01)

(52) U.S. Cl.
CPC .......... *G02B 6/4246* (2013.01); *G02B 6/428* (2013.01); *G02B 6/4269* (2013.01); *G02B 6/4271* (2013.01); *G02B 6/4292* (2013.01)

(58) Field of Classification Search
None
See application file for complete search history.

(56) References Cited

U.S. PATENT DOCUMENTS 7,738,747 B2 * 6/2010 Miyokawa ........... G02B 6/4201
 385/14
9,330,997 B1 5/2016 Lim et al.
(Continued)

FOREIGN PATENT DOCUMENTS

EP  1393109 A1  3/2004
EP  3213133 A1  9/2017
(Continued)

OTHER PUBLICATIONS

PCT Notification of Transmittal of the International Search Report and the Written Opinioin of the International Searching Authority, or the Declaration for Application No. PCT/US2020/026238 dated Jul. 17, 2020.

(Continued)

*Primary Examiner* — Rhonda S Peace
(74) *Attorney, Agent, or Firm* — Patterson + Sheridan, LLP

(57) ABSTRACT

The present disclosure provides a frame lid assembly, which may be used in assembling an optical platform to provide isolated thermal conduction paths for various elements thereof. The frame lid assembly includes a first frame lid, including: a foot, disposed in a first plane; a roof, disposed in a second plane parallel to the first plane, the roof defining a port as a first through-hole that is perpendicular to the second plane; a wall, disposed obliquely to the first plane, separating the roof from the foot, the wall defining a slot as a second through-hole that is parallel to the first plane; a second frame lid connected to the first frame lid and thermally isolated from the first frame lid, the second frame lid including: a cap, connected to the roof via a thermal insulator; and a plug, extending perpendicularly from the cap through the port.

20 Claims, 21 Drawing Sheets

(56) References Cited

U.S. PATENT DOCUMENTS

| | | |
|---|---|---|
| 9,688,453 B2 | 6/2017 | Savic et al. |
| 9,874,688 B2 | 1/2018 | Doerr et al. |
| 10,260,782 B2 | 4/2019 | Savic et al. |
| 10,624,240 B2 * | 4/2020 | Leigh .................... G02B 6/4269 |
| 2013/0043581 A1 | 2/2013 | Negoro |
| 2013/0058617 A1 | 3/2013 | Chan et al. |
| 2016/0116688 A1 | 4/2016 | Hochberg et al. |
| 2016/0291265 A1 | 10/2016 | Kinghom et al. |
| 2016/0291269 A1 | 10/2016 | Klein et al. |
| 2017/0045697 A1 | 2/2017 | Hochberg et al. |
| 2018/0052290 A1 | 2/2018 | Kinghom et al. |
| 2018/0196196 A1 | 7/2018 | Byrd et al. |
| 2018/0203187 A1 | 7/2018 | Doerr et al. |
| 2018/0247880 A1 | 8/2018 | Fu et al. |
| 2018/0259730 A1 | 9/2018 | Hochberg et al. |
| 2019/0179091 A1 | 6/2019 | Kinghom et al. |

FOREIGN PATENT DOCUMENTS

| | | | |
|---|---|---|---|
| JP | 2005191313 A | 7/2005 | |
| TW | 201629559 A | 8/2016 | |
| WO | WO-02093222 A1 * | 11/2002 | ........... G02B 6/4219 |
| WO | 2016069620 A1 | 5/2016 | |
| WO | 2016161150 A1 | 10/2016 | |
| WO | 2017188971 A1 | 11/2017 | |
| WO | 2018127531 A1 | 7/2018 | |

OTHER PUBLICATIONS

"2D vs. 2.5D vs. 3D ICs 101," [Accessed Jul. 17, 2019] https://www.eetimes.com/document.asp?doc_id=1279540.

* cited by examiner

FRAME LID FOR IN-PACKAGE OPTICS

CROSS-REFERENCES TO RELATED APPLICATIONS

The present application claims priority to U.S. Provisional Patent Application 62/831,093 filed on 2019 Apr. 8, which is incorporated herein by reference in its entirety.

TECHNICAL FIELD

Embodiments presented in this disclosure generally related to in-package optics. More specifically, embodiments disclosed herein relate to frame lids for protection and thermal dissipation for electrical and optical components of an in-package optical assembly.

BACKGROUND

The speed, size and data processing power of ASICs (Application-Specific Integrated Circuits) have increased tremendously, and a large number of packaging technologies such as 2.5D and 3D integration of ICs (Integrated Circuits) using interposers and TSVs (Through Silicon Vias) as well as various fan-out technologies are being developed. Electrical components produce waste heat during operation, which can damage or interfere with the operation of electrical or optical components in a packaged optical device. As the currents used to power electrical devices increase, so too does the heat produced by those components.

In addition to 2.5D or 3D integration of ICs, an ASIC package also includes a heat spreader, Thermal Interface Material (TIM), frame lid and heat sink in order to dissipate the heat generated by the ICs. Typically, thermal interface material is dispensed on the backside of the silicon after chip-attachment, and the heat spreader is assembled on the top. An adhesive material glues the heat spreader leg to the substrate. A heat spreader is conventionally made of Copper and alloy plating or another heat conductive material, and can be manufactured into a desired shape via a stamping method. TIM is typically a flowable material with high thermal conductivity and can include Indium and phase change polymers. After the heat spreader is attached (and any adhesives applied between the lid and the substrate), a curing process at a pre-defined pressure and temperature (e.g., 120-150 degrees C.) is used to cure the heat spreader (and any adhesives).

With the need for In Package Optics (optics on the same substrate with ASICs), it is often desirable that the optical packaging be compatible with conventional ASIC packaging in order to leverage the ASIC packaging infrastructure and economies of scale in producing In Package Optics, otherwise the operations and heat of the ASIC may damage the optics or cause the optics to perform erratically. For a conventional ASIC package, a frame lid is mounted above the ASIC in order to provide protection as well as heat dissipation. The electrical connections (e.g., power, ground, I/O) are made though an Interposer and substrate and/or the PCB (Printed Circuit Board). However, optical I/O connections through PCBs are difficult to form.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
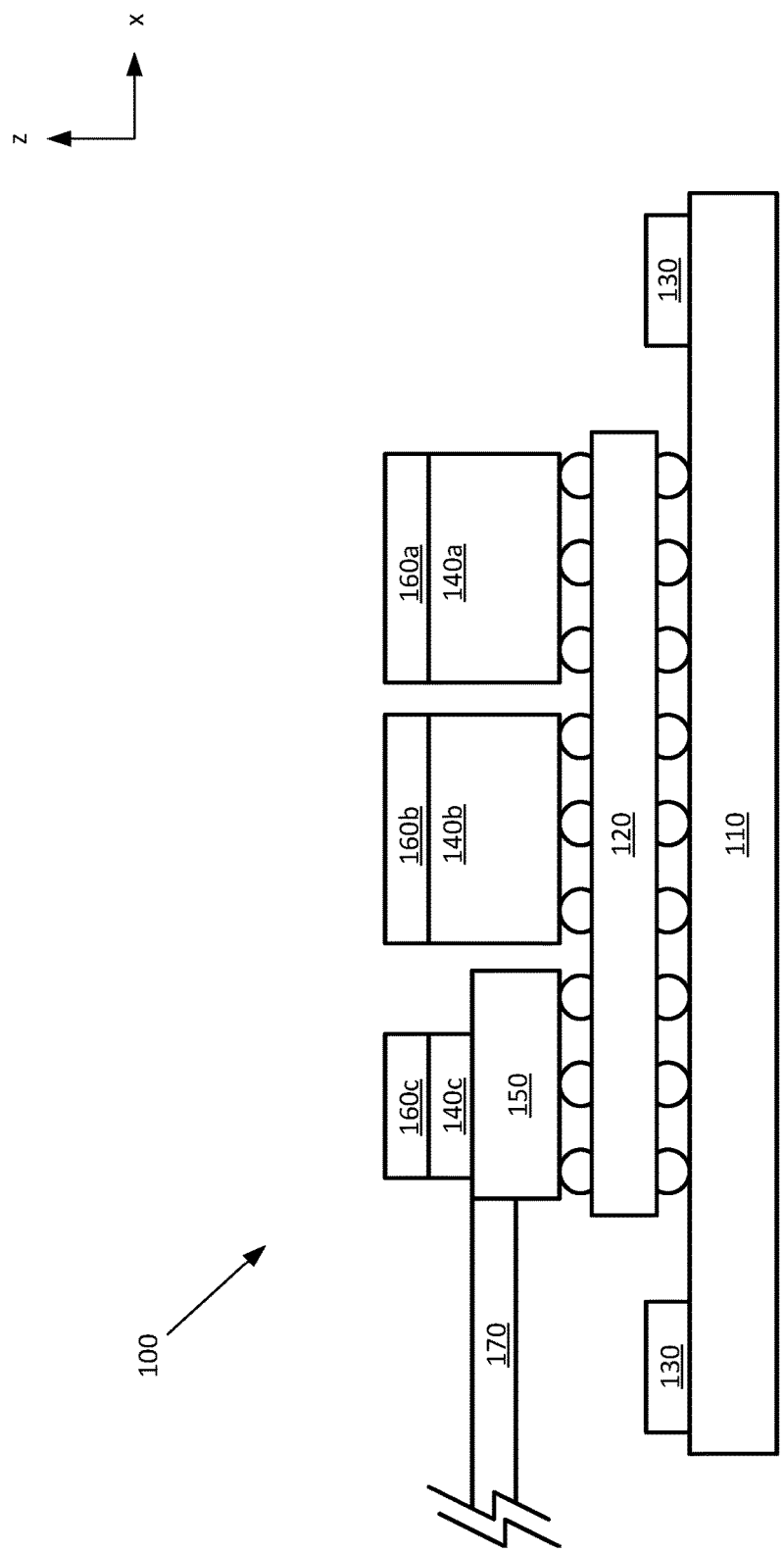
FIGS. 1A-1C illustrate an optical assembly to which a frame may be attached, according to embodiments of the present disclosure

One embodiment presented in this disclosure provides a platform that includes: a substrate; a first IC (Integrated Circuit) mounted to the substrate; a second IC; a first frame lid mounted to the substrate and defining a cavity with the substrate that encapsulates the first IC and the second IC, the first frame lid comprising: a first roof disposed in a first plane parallel to the substrate, the first roof defining a port providing access to the second IC through the first roof; a foot disposed in a second plane parallel to the first plane and connected to the substrate; and a wall, connecting the first roof to the foot; and a second frame lid mounted to the first roof via a thermal isolator and extending through the port to be in thermal contact with the second IC.

One embodiment presented in this disclosure provides a method for attaching a frame assembly to a circuit package comprising a substrate, a first EIC (Electronic Integrated Circuit) mounted to the substrate and a second EIC, in which the method includes: applying an adhesive to the substrate; applying a first thermal interface material to a first surface of the first EIC; applying a second thermal interface material to a second surface of the second EIC; placing a first frame lid onto the circuit package, wherein a foot of the first frame lid contacts the adhesive, a roof of the first frame lid contacts the first thermal interface material, and the second thermal interface material is exposed by a port defined in the roof; placing a second frame lid through the port to contact the second thermal interface material, wherein the second frame lid is thermally isolated from the first frame lid; and curing the adhesive, the first thermal interface material, and the second thermal interface material to bond the first frame lid and the second frame lid onto the circuit package and to seal the port.

One embodiment presented in this disclosure provides a frame lid assembly that includes: a first frame lid, including: a foot, disposed in a first plane; a roof, disposed in a second plane parallel to the first plane, the roof defining a port as a first through-hole that is perpendicular to the second plane; a wall, disposed obliquely to the first plane, separating the roof from the foot, the wall defining a slot as a second through-hole that is parallel to the first plane; a second frame lid connected to the first frame lid and thermally isolated from the first frame lid, the second frame lid including: a cap, connected to the roof via a thermal insulator; and a plug, extending perpendicularly from the cap through the port.

Example Embodiments

In various embodiments a frame assembly may be provided in one or several components to protect a photonic assembly captured within the frame assembly from physical contact, and from thermal effects. The frame assembly includes an opening for an optical fiber or other physical communications channel, which may later be sealed, and one or more thermal contact points for electrical circuits captured inside of the frame assembly to allow heat to be transferred from the electrical circuits to the environment outside of the frame assembly. In some embodiments, in order to create an optical input/output (I/O) for an in-package optics solution, a silicon photonic (SiP) chip is mounted on an edge of an interposer within the frame assembly in order to perform Optical to Electric and Electric to Optical conversion, and an optical connection is made between a Fiber Array Unit (FAU) and the SiP chip. The frame lid design is compatible with the assembly process of attaching the FAU and has an opening to allow optical fibers and other optical leads to come out the frame lid.

In various embodiments, a sealant is applied around the optical connections and the lid and/or substrate to seal the internal components inside the lid, and to secure the optical connections. The sealant may be selected based on its thermal properties so that the curing processes used for the Thermal Interface Material (TIM) and adhesives also cure the sealant. In various embodiments, the seal achieved by the sealant is hermetic (i.e., water tight or air tight).

In some embodiments, the opening may be a slot that leaves an open pathway on an underside of the lid so that the lid may be placed vertically over the internal components and the optical lead. In some embodiments that use an open-slot pathway, a second base component of an insert is positioned between the optical lead and the substrate, so that a gap between the optical lead and the substrate is reduced. In such embodiments, the second base component/insert may be placed prior to connecting or after connecting the optical leads, and may be affixed to the substrate and the lid during curing. In other embodiments, the opening may be defined as a closed shape (e.g., a rectangle, circle, oval, etc.), and the lid slides into position along the optical lead before being secured to the substrate at a desired location.

Some embodiments provide for a one-lid design that couples various components captured in a cavity defined between the frame lid assembly and the substrate with the frame lid, to allow heat transfer from those components to the frame lid and the environment outside of the cavity. Some embodiments provide for a two-lid design that decouples heat transfer from one section (e.g., the ASIC die) to another section (e.g., the SiP engine) while providing independent heat dissipation paths for both sections. For example, the ASICs for>50 TB systems are expected to dissipate hundreds of Watts of power, and the operation of the components of a SiP may be sensitive to heat. Accordingly, thermal isolation between the ASIC and the nearby SiP is highly desired. Some of the embodiments provide a frame lid that has a first opening for optical connections to the SiP die and a second opening for a second frame lid to connect with the SiP.

The one-lid and two-lid designs each include a frame lid that is attached to the first section of the in-package optic, in which an opening or hole may be defined for the second frame lid to be attached to the second section. The second lid is physically and thermally connected via a TIM to the second section (e.g., the SiP engine) and physically connected to the first lid via a thermal insulator, which (at least partially) thermally isolates the heat dissipation path for the second section from the heat dissipation path for the first section. In some embodiments, the thermal insulation seals (e.g., hermetically) an interior cavity of the in-package optic (defined between the lid and the substrate). In some embodiments, the hole is defined during fabrication of the in-package optic, while in other embodiments, the hole is defined at a later time and resealed by the second lid (e.g., as a patch). In some embodiments, the first lid is cured to the substrate at the same time as the second lid is cured to the first lid using the same curing process, while in other embodiments, the second lid is cured to the first lid before or after curing the first lid to the substrate and using a different curing process (e.g., a different temperature or pressure, light curing). In various embodiments, the first lid and the second lid may be made from the same or from different material, and may be connected to individual cooling or heat dissipation systems that are of the same or of different types. For example, a second lid may be connected to a radiative heat sink, whereas the first lid may be connected to a fluid-based heat sink.

The frame lid used for in-package optics has an opening for optical connections to the SiP die and the design provides protection as well as access to the SiP chip for fiber assembly. In addition, the two lid design allows decoupling of heat transfer from one section (e.g., the ASIC die) to another section (e.g., the SiP engine) while providing heat dissipation paths for both sections. In addition to having cutouts/openings for optical connections, cutouts and openings may be included for other purposes such as epoxy dispense/cure, rework, visioning/inspection, etc.

Figure 1B:
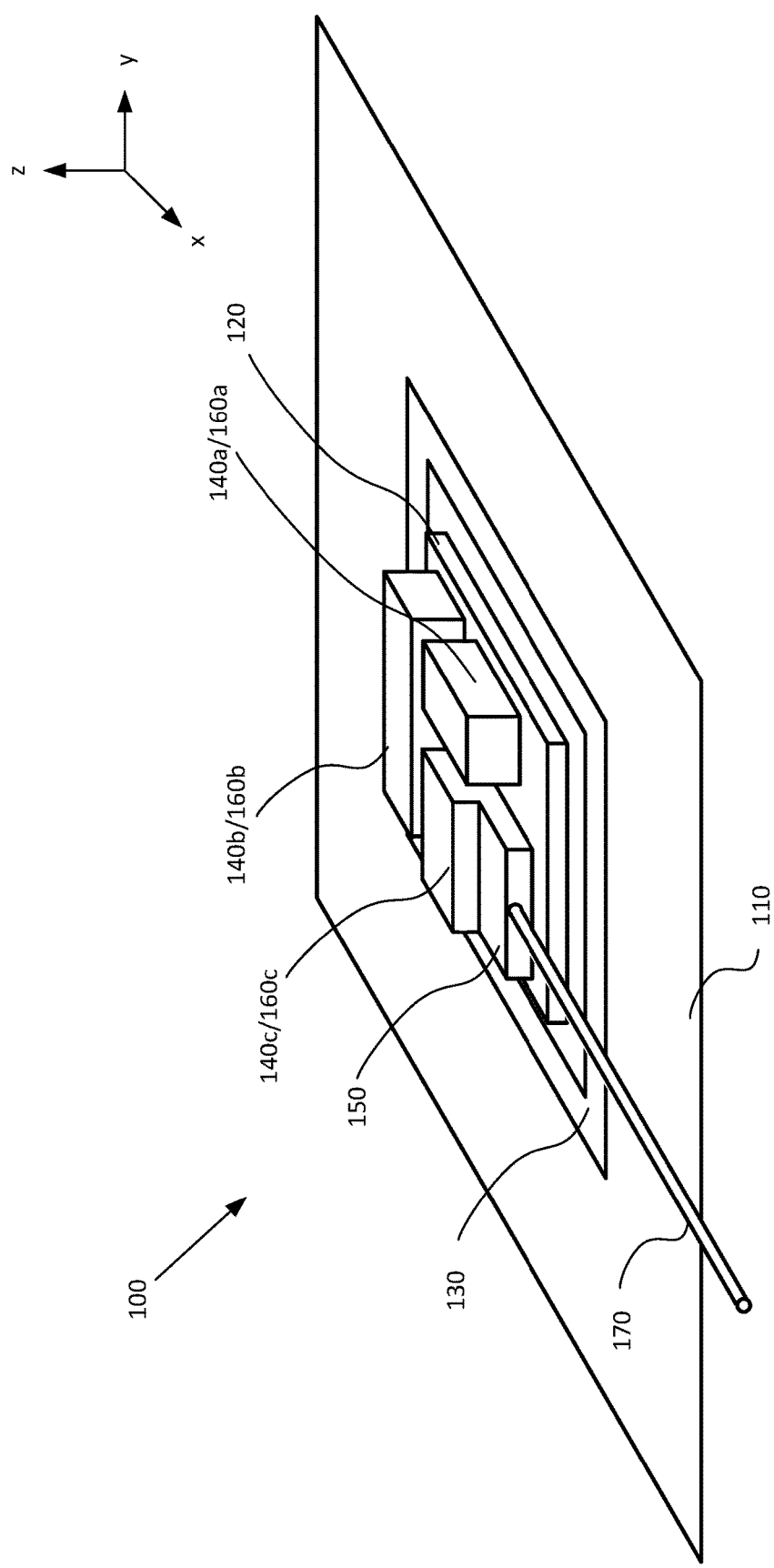
Figure 1C:
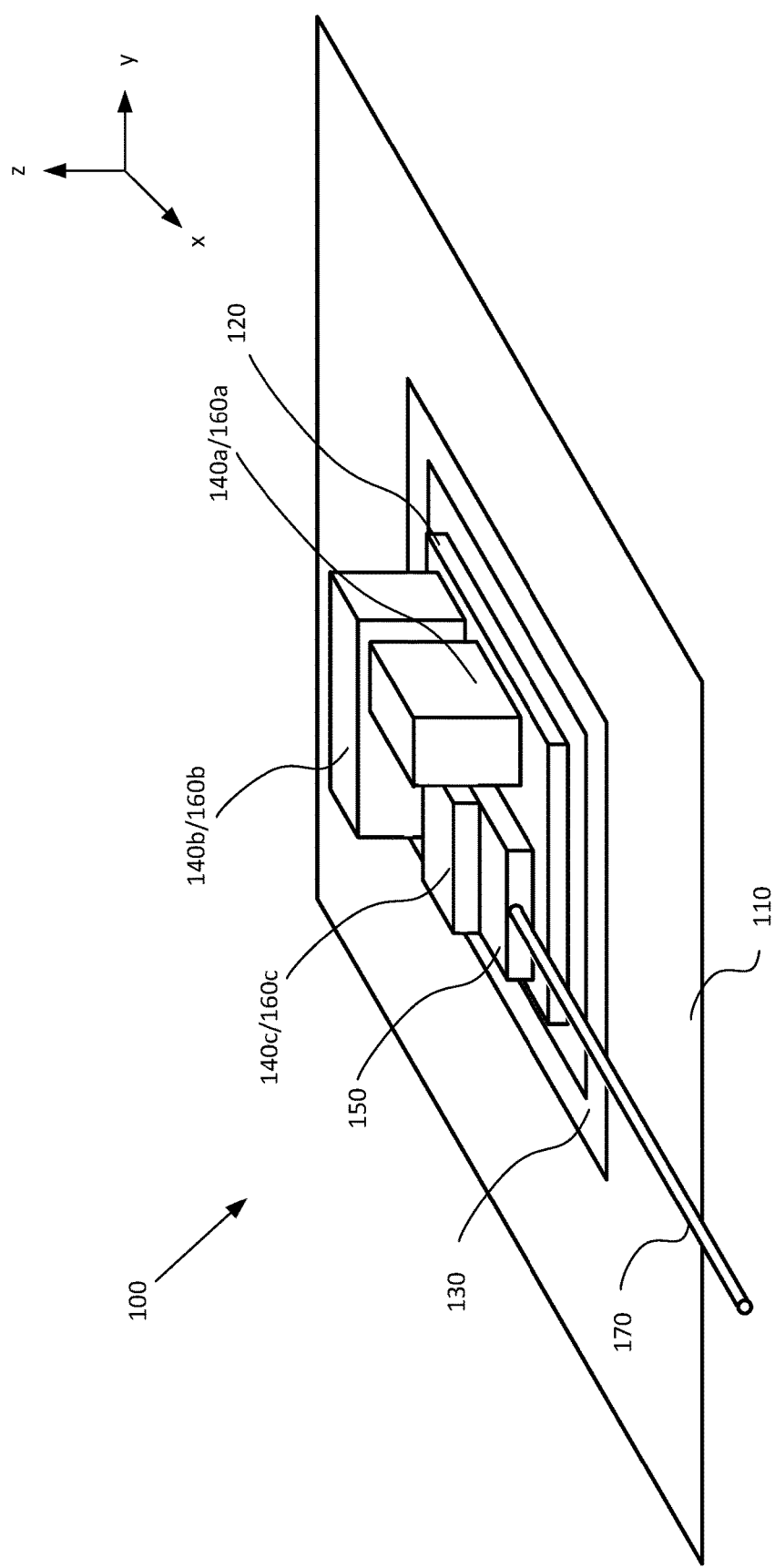

FIGS. 1A-1C illustrate an optical assembly 100 or other circuit package to which a frame lid (discussed in greater detail elsewhere in the present disclosure) may be attached, according to embodiments of the present disclosure.

FIG. 1A illustrates a profile view of the optical assembly 100, illustrating a substrate 110 to which an interposer 120 and adhesive 130 are attached on one side. The interposer 120 is connect to a first Photonic Integrated Circuit (PIC) 150, a first Electrical Integrated Circuit (EIC) 140a (generally, EIC 140), and a second EIC 140b on an opposite side to where the substrate 110 is attached. The interposer 120 provides for electrical connectivity between the circuits connected thereto and may include one or more connections to Through Silicon Vias (TSV) defined in the substrate 110 to provide electrical connections to devices outside of the optical assembly 100.

The PIC 150 is part of a SiP platform, which includes a third EIC 140c connected to the PIC 150 and an optical fiber 170 (or other optical communications channel) connected to the PIC 150. The PIC 150 provides for one or more of the transmission of optical signals (e.g., via a laser and associated modulators and optical amplifiers) and/or of the reception of optical signals (e.g., via a photodiode and associated modulators and optical amplifiers) over the optical fiber 170. The PIC 150 may be mounted within a Fan-Out Wafer-Level Package, and the third EIC 140c may be mounted to the PIC 150 to drive a laser or other optical component defined in the PIC 150.

Each of the EICs 140a-c is associated with a corresponding TIM 160a-c (generally, TIM 160). The TIM 160 may include various materials, such as Indium and phase change polymers, that are selected to conduct heat generated by the associated EIC 140 to a frame lid, to thereby dissipate heat from the EIC 140 into the external environment. Although illustrated as even layers across the EIC 140, and of even height, in various embodiments the TIM 160 may be applied to a sub-portion of the EIC 140 and may be applied at different heights/thicknesses to each of the EIC 140. Additionally, one or more EIC 140 may omit a corresponding TIM 160 in various embodiments.

FIG. 1B and FIG. 1C illustrate isometric views of optical assemblies 100 with the same elements described in FIG. 1A. FIG. 1B illustrates a first arrangement of components on the interposer 120, where the upper surfaces of the first EIC 140a, second EIC 140b, and third EIC 140c are disposed in one plane. FIG. 1C illustrates a second arrangement of components on the interposer 120, where the upper surfaces of the first EIC 140a and second EIC 140b are disposed in one plane, and the upper surface of the third EIC 140c is disposed in a different plane. Each of the EICs 140 may be disposed in the same or different planes based on the relative heights of the EICs 140 relative to the interposer 120 or substrate 110. A fabricator may compensate for different relative heights of the EICs 140 by one or more of: different heights of TIMs, a two-lid design, etc.

The optical assembly 100 illustrated in FIGS. 1A-1C is provided for explanatory purposes. The present disclosure is contemplated for use with optical assemblies 100 using more or fewer than the illustrated components and in different arrangements than illustrated in FIGS. 1A-1C.

Figure 2A:
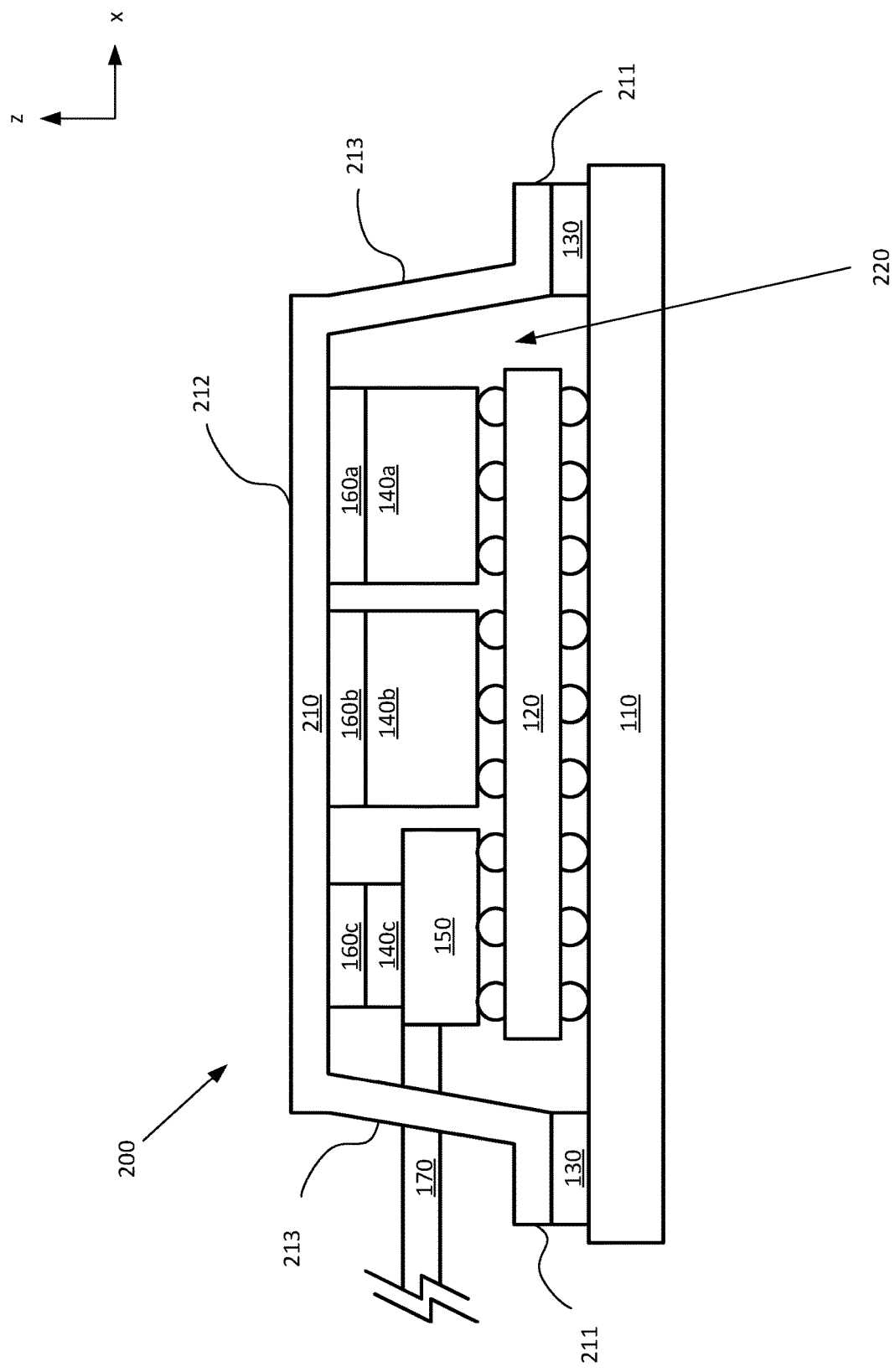
FIGS. 2A-2C illustrate a photonic platform using a one-lid design, according to embodiments of the present disclosure.
Figure 2B:
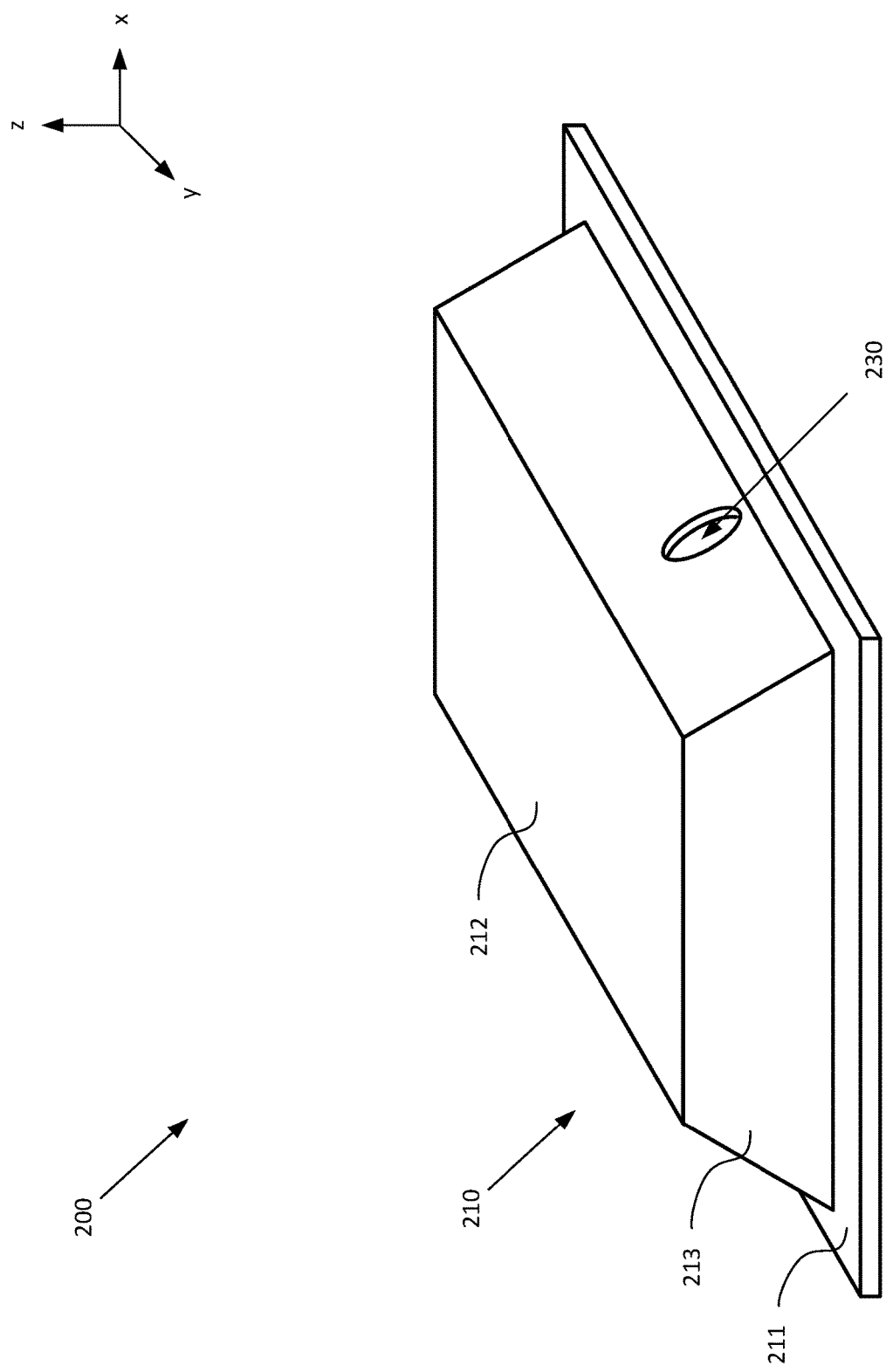
Figure 2C:
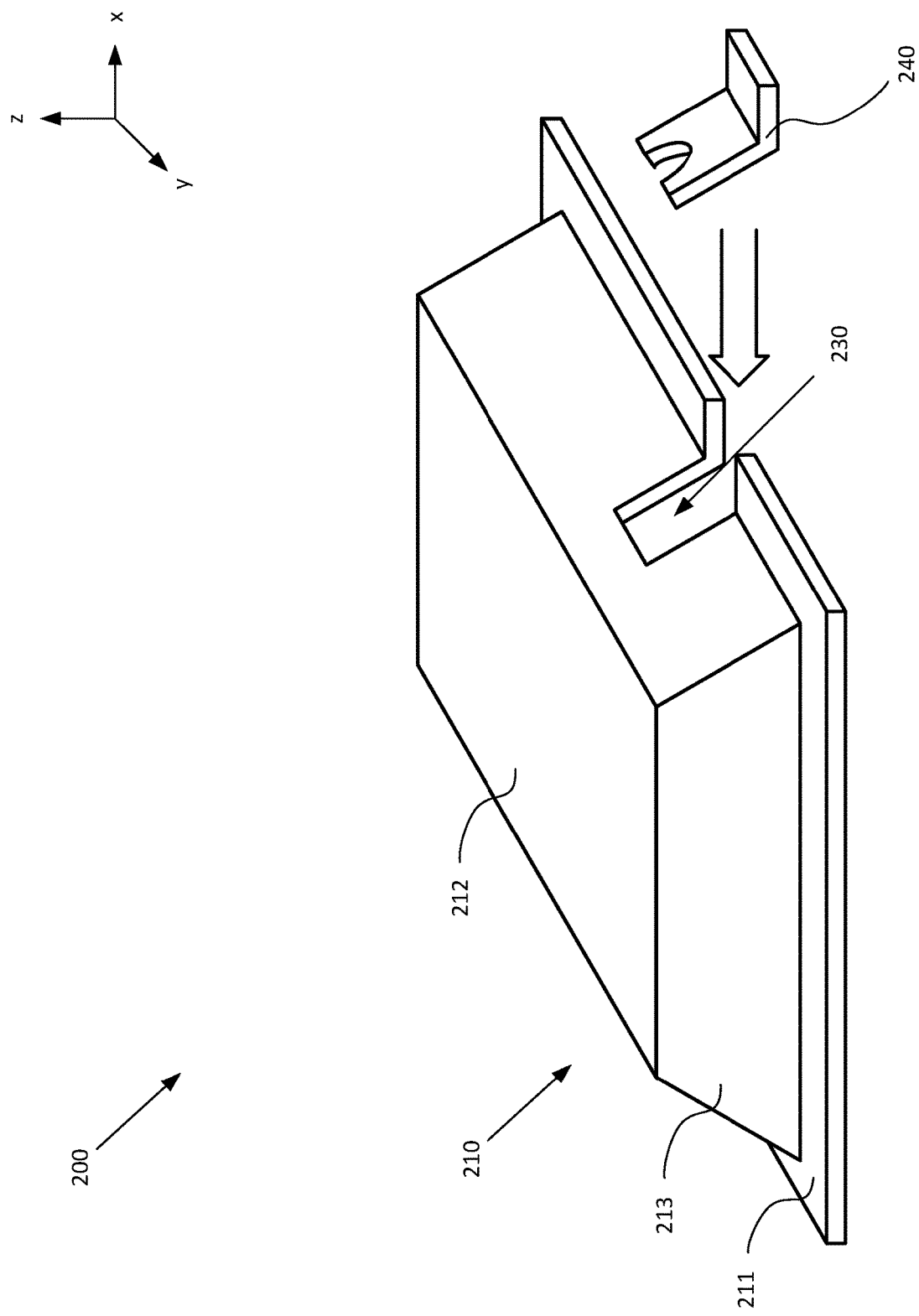

FIGS. 2A-2C illustrate a photonic platform 200 using a one-lid design. In various embodiments, a one-lidded photonic platform 200 may be modified into a two-lidded photonic platform 300 (as is discussed in relation to FIGS. 3A-3F), for example, when retrofitting, repairing, or inspecting internal components of a one-lidded photonic platform 200.

FIG. 2A illustrates a profile view with a portion of a one-lidded photonic platform 200 cutaway to show details of an optical assembly 100 connected thereto. The photonic platform 200 includes the components of the optical assembly (such as is illustrated in FIGS. 1A-1C) and a first frame lid 210. The first frame lid 210 includes a foot 211 in contact with the adhesive 130 and (when cured) bonded to the substrate 110 via the adhesive 130, a roof 212 in contact with the TIM 160 of the EIC 140 within a cavity 220 defined between the first frame lid 210 and the substrate 110, and a wall 213 that separates the foot 211 from the roof 212 and defines a slot 230 (not visible in FIG. 2A) as a through-hole that the optical fiber 170 passes into/out of the cavity 220. In various embodiments, the adhesive 130 forms a bond between the frame lid 210 and the substrate 110 that is airtight or watertight, and a sealant (not illustrated) is placed in the slot 230 to form an airtight or watertight seal so that the cavity 220 is hermetically sealed from the external environment when cured.

FIG. 2B illustrates an isometric view of a frame lid 210 as may be used in a photonic platform 200 using a one-lid design, illustrating the slot 230. The slot 230 is defined in the wall 213 as a through-hole that the optical fiber 170 may pass. The through-hole for the slot 230 runs parallel to the plane of the substrate 110, although the slot 230, due to the angle of the wall 213 relative to the foot 211 and the roof 212, may be defined in various planes that are nonparallel to the planes in which the foot 211 and the roof 212 are defined. Although shown as generally circular in FIG. 2B, the slot 230 may be defined with other cross-sectional shapes in other embodiments. Although the wall 213 is illustrated with two or more individual surfaces, surrounding a roof 212 having a generally rectangular areal section, in other embodiments, the wall 213 may be provided with a single surface and in different cross sectional areas (e.g., as the one-sided perimeter of a circular roof 212, as the eight-sided perimeter of an octagonal roof 212).

FIG. 2C illustrates an isometric view of a frame lid 210 and an insert 240 as may be used in a photonic platform 200 using a one-lid design. In some embodiments, the slot 230 is defined with an opening through the wall 213 and the foot 211 of the frame lid 210 so as to allow for the frame lid 210 to be placed vertically over the optical fiber 170 and onto the adhesive 130, as is discussed in greater detail in regard to FIGS. 5A and 5B and FIGS. 6A and 6B. In contrast, embodiments defining the slot 230 such that the wall 213 and/or foot 211 define a boundary of the slot 230 (e.g., as in FIG. 2B), may require the optical fiber 170 to be connected to the PIC 150 after placing the frame lid 210 over the optical assembly 100 or by sliding the frame lid 210 into position along the length of an optical fiber 170 attached to the PIC 150, as is discussed in greater detail in regard to FIGS. 7A and 7B.

The insert 240, which may be set in place before placing the frame lid 210 over the optical fiber 170 or after placing the frame lid 210 over the optical fiber 170, provides additional support for the optical fiber 170 and reduces the cross-sectional area of the slot 230 that is to be sealed with a sealant to ensure that the cavity 220 is hermetically sealed from the outside environment. The insert 240 is adapted to the size and shape of the slot 230 and the size, shape, and relative location of the optical fiber 170, and accordingly may be provided in several different sizes, shapes, and orientations in various embodiments. Examples of several inserts 240, and the sub-features thereof, are discussed in greater detail in regard to FIG. 4.

FIGS. 3A-3G illustrate a photonic platform 300 using a multi-lid design. In various embodiments, a multi-lidded photonic platform 300 may be modified from a one-lidded photonic platform 200 (as is discussed in relation to FIGS. 2A-2C), for example, when retrofitting, repairing, or inspecting internal components of a one-lidded photonic platform 200. Although illustrated and discussed primarily as a two-lidded design, it is contemplated that more than two secondary (or second) frame lids 310 may be included in a multi-lid design with corresponding ports 320 through the primary (or first) frame lid 210.

Figure 3A:
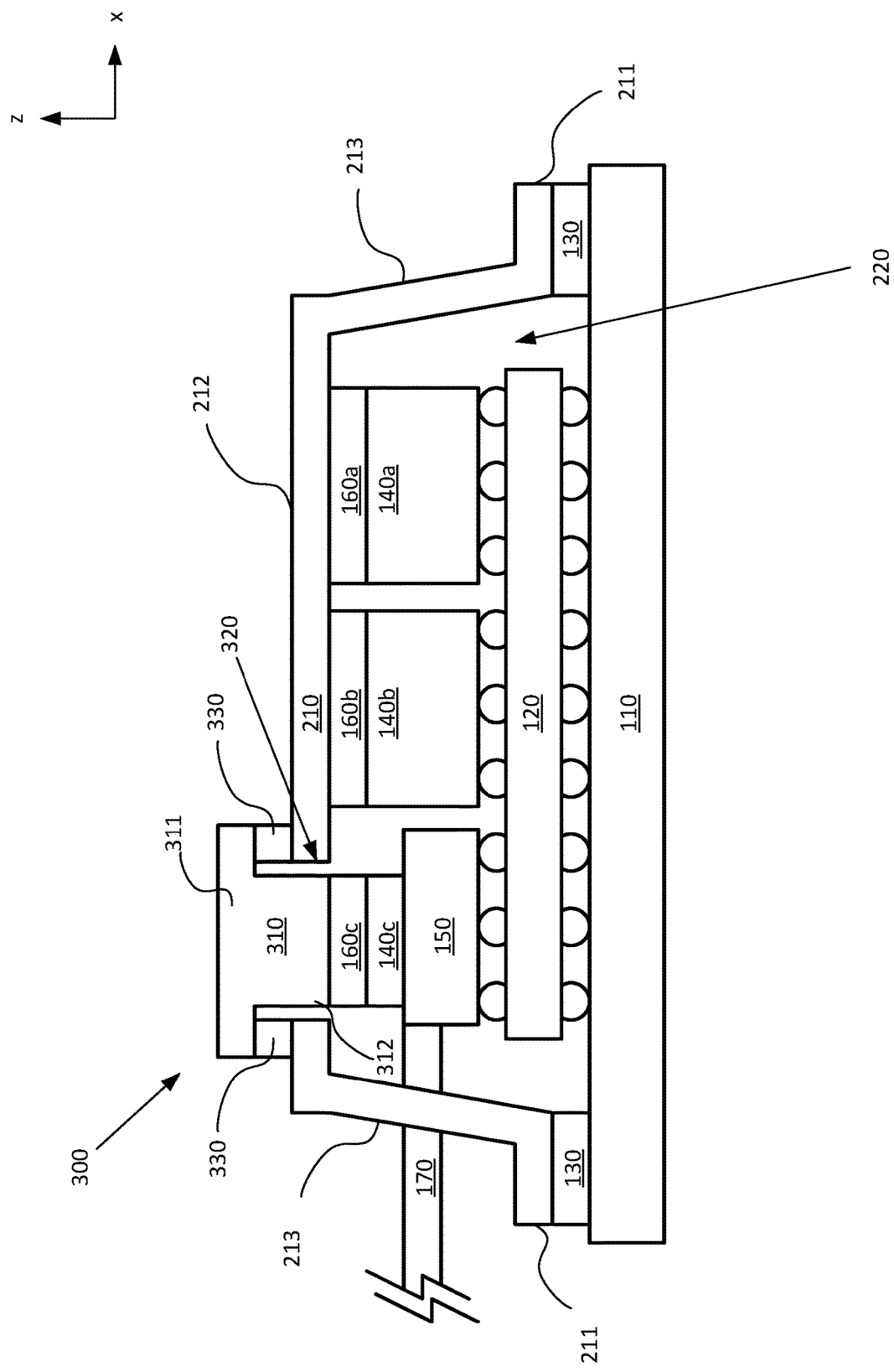
FIGS. 3A-3G illustrate a photonic platform using a multi-lid design, according to embodiments of the present disclosure.
Figure 3B:
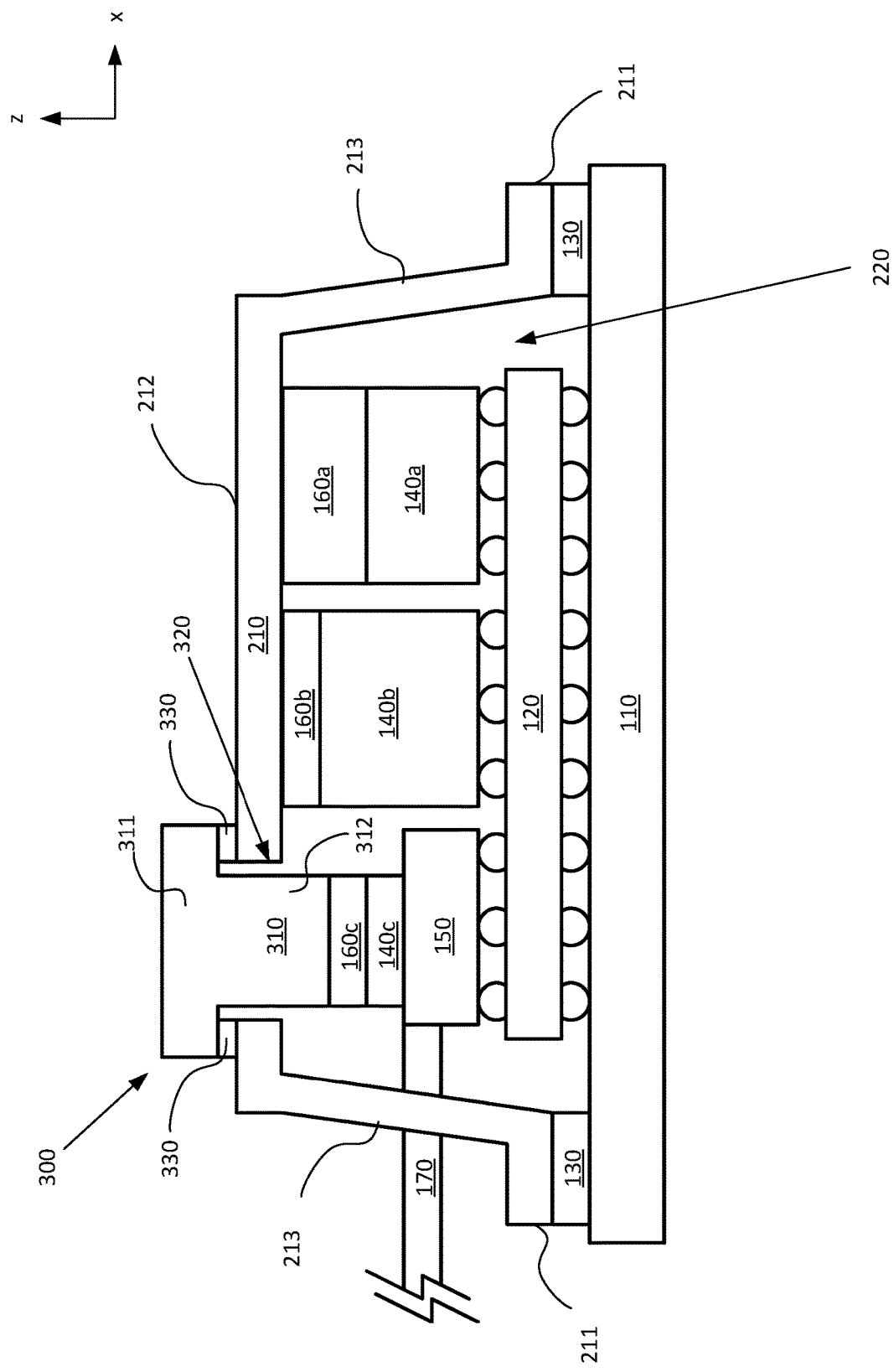
Figure 3C:
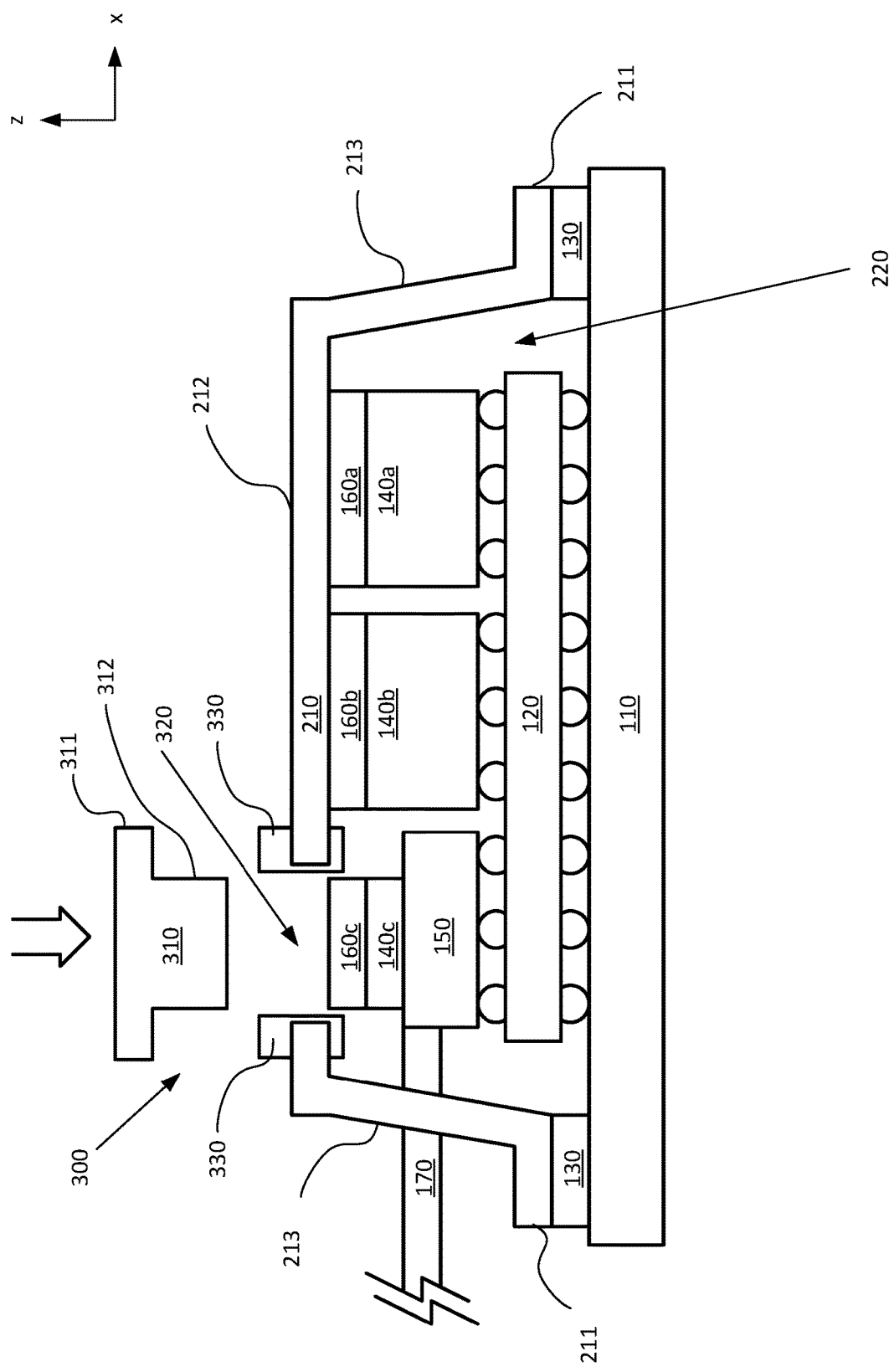

FIGS. 3A-3C illustrate profile views with a portion of a two-lidded photonic platform 300 cut away to show details of an optical assembly 100 connected thereto. The photonic platform 300 includes the components of the optical assembly 100 (such as is illustrated in FIGS. 1A-1C), a first frame lid 210, and a second frame lid 310. As in the one-lidded photonic platform 200, the first frame lid 210 includes a foot 211 that is in contact with the adhesive 130 and (when cured) bonded to the substrate 110 via the adhesive 130, a roof 212 that is in contact with the TIM 160a,b of the EIC 140a,b within a cavity 220 defined between the first frame lid 210 and the substrate 110, and a wall 213 that separates the foot 211 from the roof 212 and defines a slot 230 (not visible in FIG. 3A) as a through-hole that the optical fiber 170 passes into/out of the cavity 220. In various embodiments, the adhesive 130 forms a bond between the first frame lid 210 and the substrate 110 that is airtight or watertight, and a sealant (not illustrated) is placed in the slot 230 to form an airtight or watertight seal so that the cavity 220 is hermetically sealed from the external environment when cured.

In addition to the first frame lid 210, the two-lidded design includes a second frame lid 310 which is inserted into the cavity 220 via a through-hole, designated as port 320, defined through the roof 212 of the first frame lid 210. The second frame lid 310 is bonded to, and thermally isolated from, the first frame lid 210 via a thermal isolator 330. The thermal isolator 330 is a thermal insulator that impedes the transfer of heat between the first frame lid 210 and the second frame lid 310, and when cured, seals the port 320. The second frame lid 310 includes a cap 311, which connects with the thermal isolator 330 to seal the port 320 and to interface with various external devices (e.g., heatsinks 340, as discussed in greater detail in regard to FIG. 3G), and a plug 312, which extends from the cap 311 into the cavity 220 to contact the TIM 160 of a designated EIC 140. Although illustrated in contact with the third EIC 140c in contact with the PIC 150, in other embodiments the second frame lid 310 may be in contact with a different EIC 140 (e.g., a thermally sensitive EIC 140 or an EIC 140 outputting a greater than average amount of heat) within the cavity 220 to thermally isolate that EIC 140 from the other EICs 140.

Although in some embodiments, such as illustrated in FIG. 3A, the upper contact surfaces of the TIMs 160 (that contact the first frame lid 210 or the second frame lid 310) may be disposed in one plane at a shared height relative to the substrate 110, in other embodiments, such as illustrated in FIG. 3B, the TIMs 160 may be located at different heights relative to the substrate 110. Therefore, the plug 312 of the second frame lid 310 may extend to various lengths from the cap 311 in various embodiments to account for EICs 140 and TIMs 160 of various heights.

In various embodiments, the second frame lid 310 may be inserted into the port 320 after the first frame lid 210 is placed over the optical assembly 100, or may be placed into the port 320 before placing the first frame lid 210 over the optical assembly 100. Additionally, the thermal isolator 330 may be placed on a first side of the roof 212 surrounding the port 320 (e.g., as in FIG. 3A) or may be placed within the port 320 (e.g., as shown in FIG. 3C).

Figure 3D:
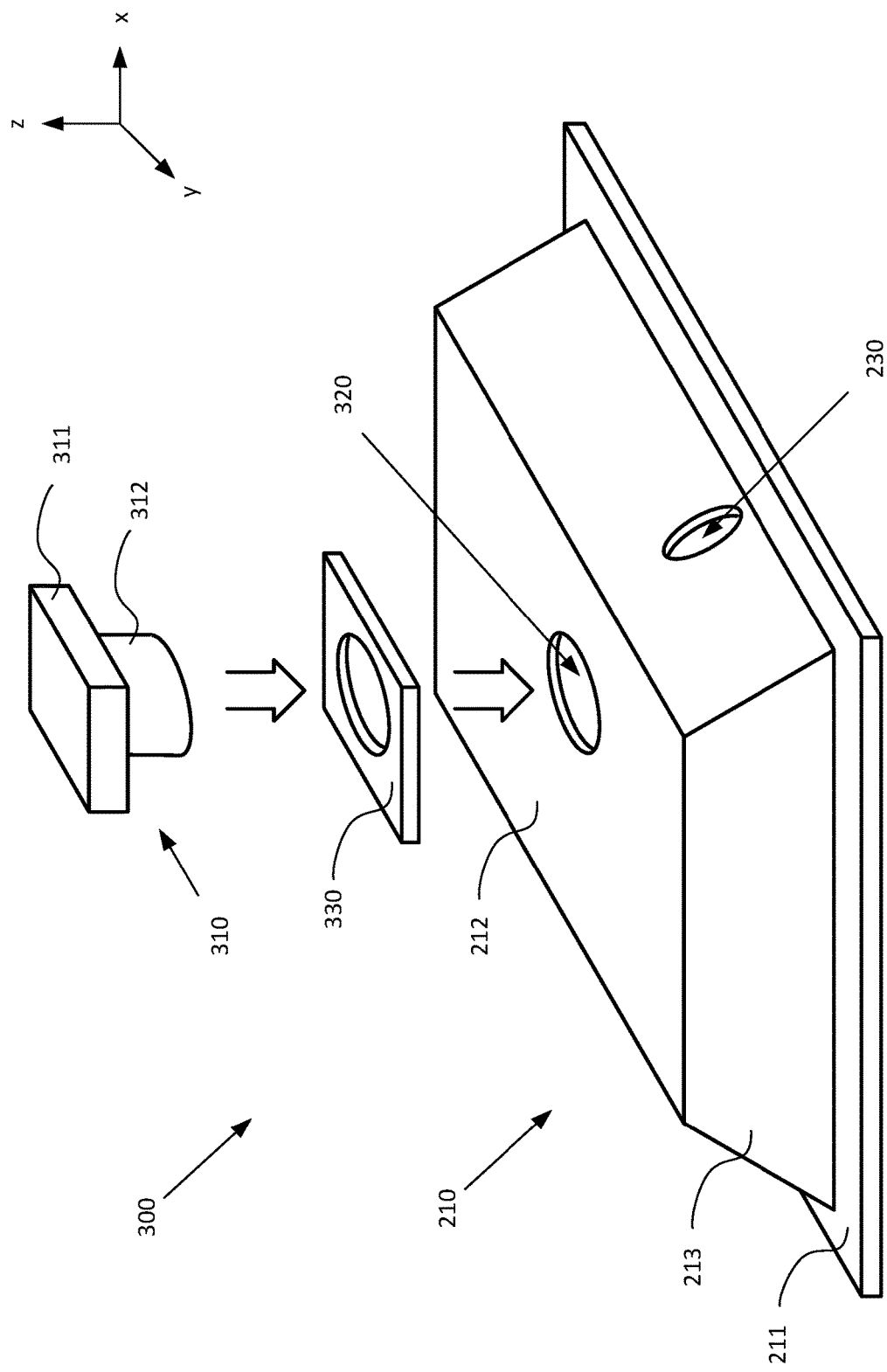
Figure 3E:
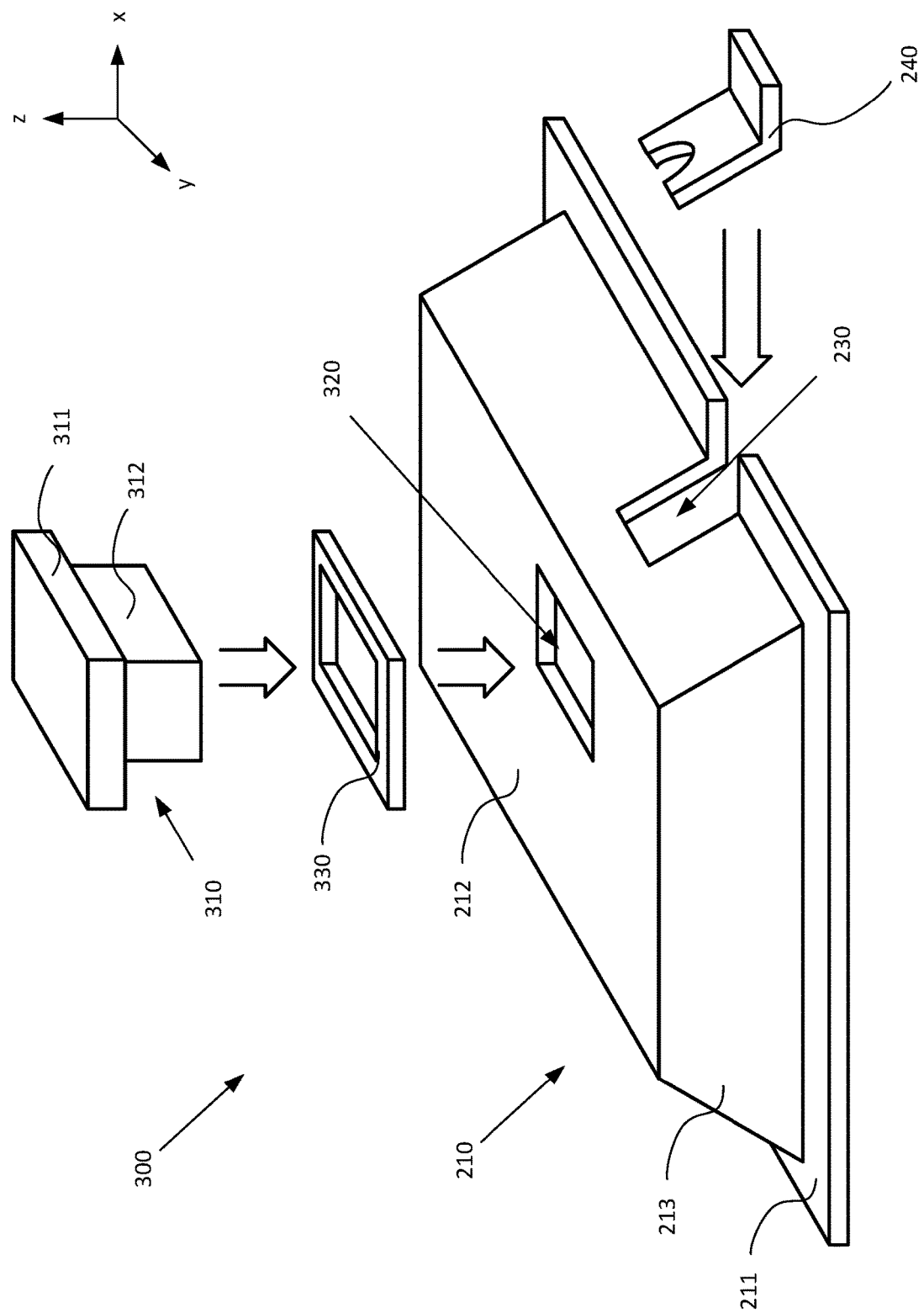
Figure 3F:
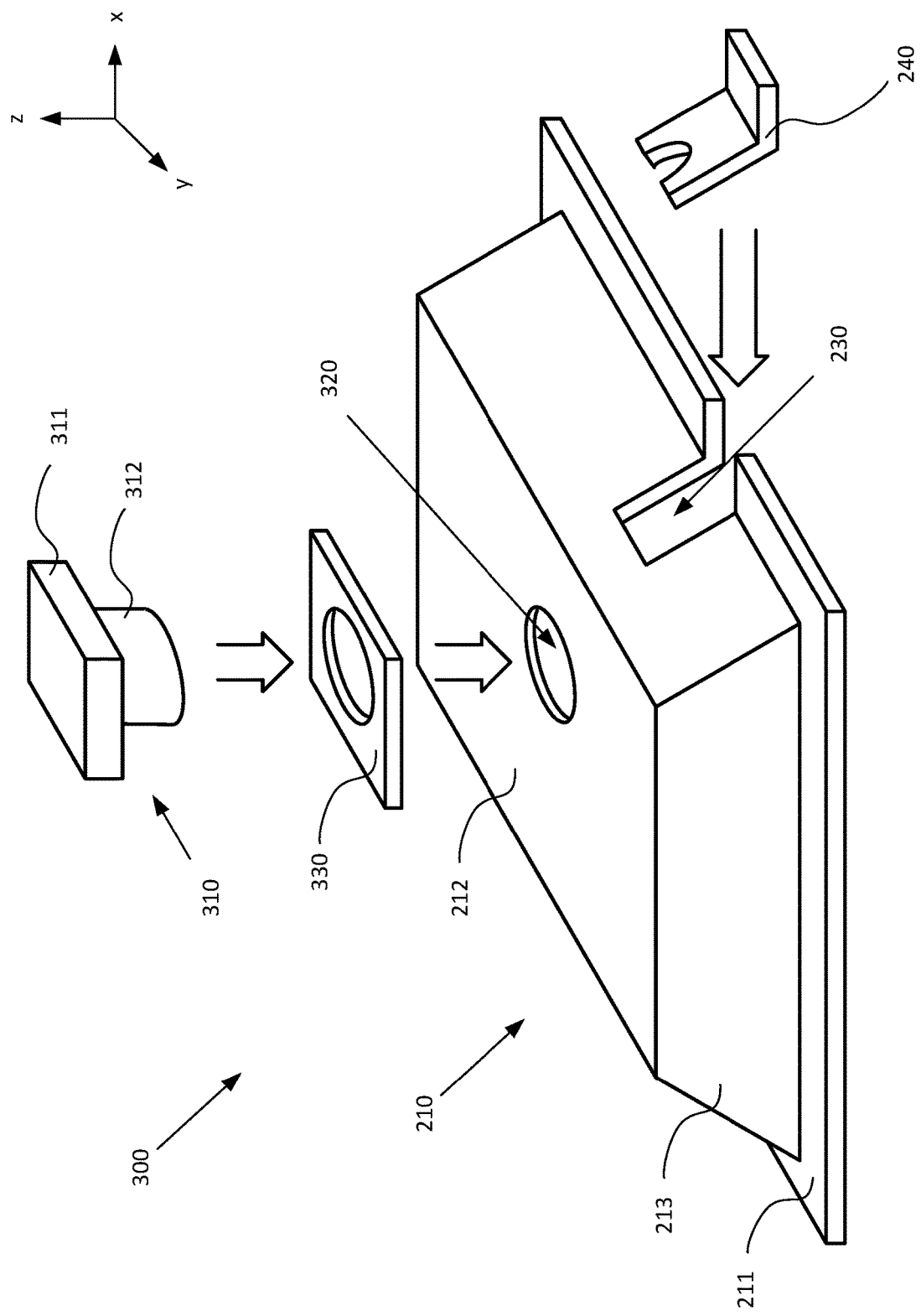

FIGS. 3D-3F illustrate isometric views of a two-lidded frame lid assembly. In some embodiments, the slot 230 is defined with an opening through the wall 213 and the foot 211 of the first frame lid 210 (e.g., as in FIGS. 3E and 3F) so as to allow for the first frame lid 210 to be placed vertically over the optical fiber 170 and onto the adhesive 130, as is discussed in greater detail in regard to FIGS. 5A and 5B and FIGS. 6A and 6B. In contrast, embodiments defining the slot 230 such that the wall 213 and/or foot 211 define a boundary of the slot 230 (e.g., as in FIG. 3D), may require the optical fiber 170 to be connected to the PIC 150 after placing the first frame lid 210 over the optical assembly 100 or by sliding the first frame lid 210 into position along the length of an optical fiber 170 attached to the PIC 150, as is discussed in greater detail in regard to FIGS. 7A and 7B.

The insert 240, which may be set in place before placing the first frame lid 210 over the optical fiber 170 or after placing the first frame lid 210 over the optical fiber 170, provides additional support for the optical fiber 170 and reduces the cross-sectional area of the slot 230 that is to be sealed with a sealant to ensure that the cavity 220 is hermetically sealed from the outside environment. The insert 240 is adapted to the size and shape of the slot 230 and the size, shape, and relative location of the optical fiber 170, and accordingly may be provided in several different sizes, shapes, and orientations in various embodiments. Examples of several inserts 240, and the sub-features thereof, are discussed in greater detail in regard to FIG. 4.

The thermal isolator 330 is sized and shaped according to the size and shape of the port 320 and the size and shape of the cap 311. The thermal isolator 330 may be placed around the perimeter of the port 320 outside of the cavity 220 (e.g., as in FIG. 3B), or may be secured to the perimeter of the port 320 both inside and outside of the cavity 220 (e.g., as in FIG. 3C). In various embodiments, the thermal isolator 330 may be cured to form an airtight or water tight seal with the cap 311 of the second frame lid 310, or may include a sealant or adhesive that forms such a seal with the cap 311 when cured. In various embodiments, the thermal isolator 330 is bonded to the first frame lid 210 before the second frame lid 310 is bonded to the thermal isolator 330 (e.g., as in FIG. 3C), or may be bonded to the first frame lid 210 and to the second frame lid 310 during one curing/fabrication process (e.g., as in FIG. 3D).

The second frame lid 310 is sized and shaped according to the size and shape of the port 320, the relative distance to the TIM 160 to which the plug 312 is to be placed in thermal contact with, and the size and shape of any external devices to be connected to the second frame lid 310. The cap 311 provides an exposed surface (opposite to the side the plug 312 extends from) to which various external devices (such as heat sinks 340 as in FIG. 3G) may be mounted and through which heat generated by the EIC 140 connected to the plug 312 may be dissipated into the environment. Although shown in FIGS. 3C and 3D with a generally rectangular shape, the cap 311 may be provided in various shapes in various other embodiments. The plug 312 may also be provided with various cross-sectioned shapes (e.g., generally rectangular in FIG. 3C and generally circular in FIG. 3D), and may extend to various lengths from the cap 311 based on the relative height of the TIM 160 and EIC 140 that the plug 312 is to connect with.

Figure 3G:
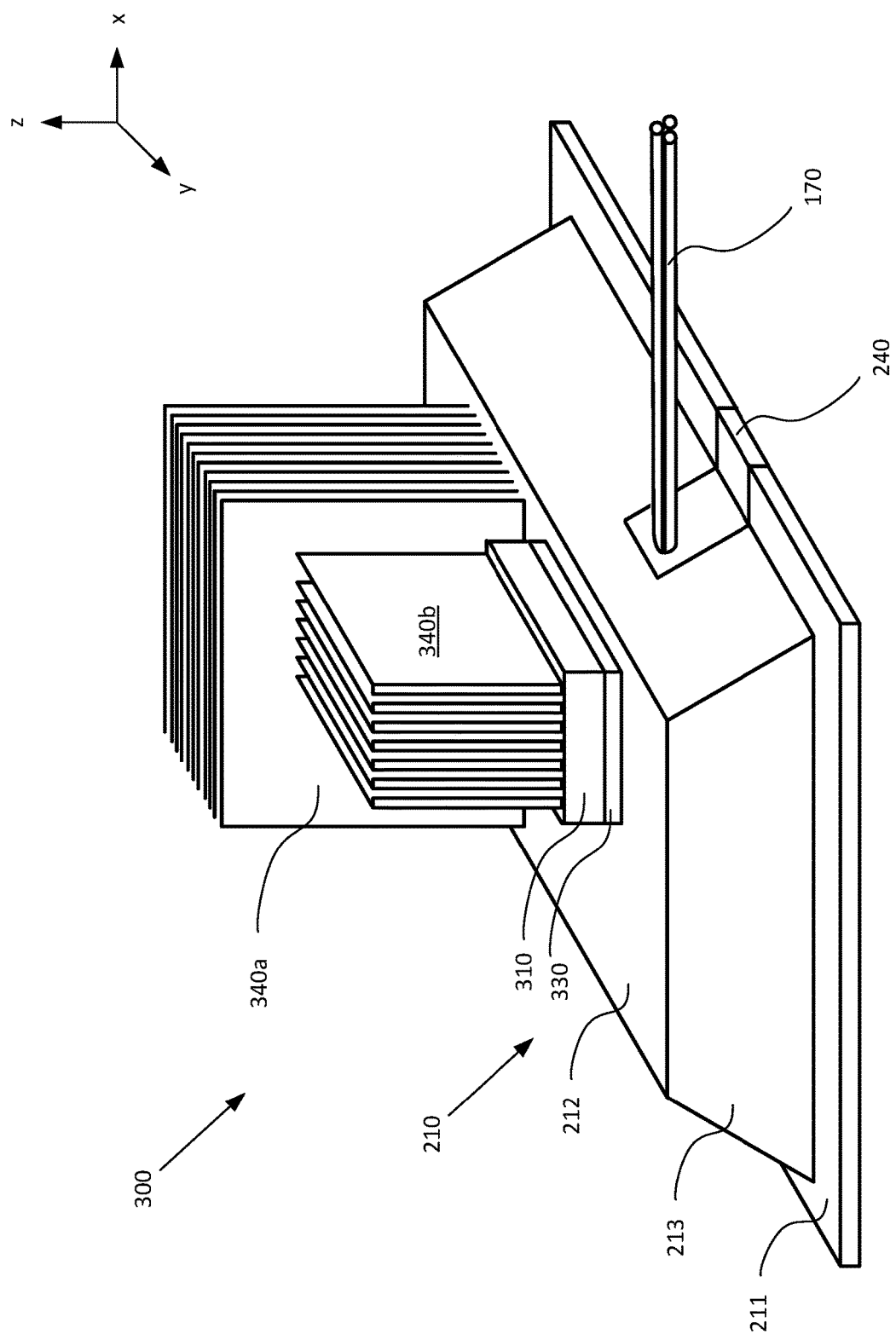

FIG. 3G is an isometric view of an assembled photonic platform 300 connected to external heatsinks 340. A first external heatsink 340a is bonded to the first frame lid 210, and a second external heatsink 340b is bonded to the second frame lid 310 in FIG. 3G. Each of the heatsinks 340 bonded to different portions of the photonic platform 300 may be of the same or of different types, and may include passive radiative heat sinks and active heat sinks (e.g., forced air, forced liquid) of various sizes, materials, and form factors based on the intended operating environments and heat generated when operating the optical assembly 100.

Figure 4:
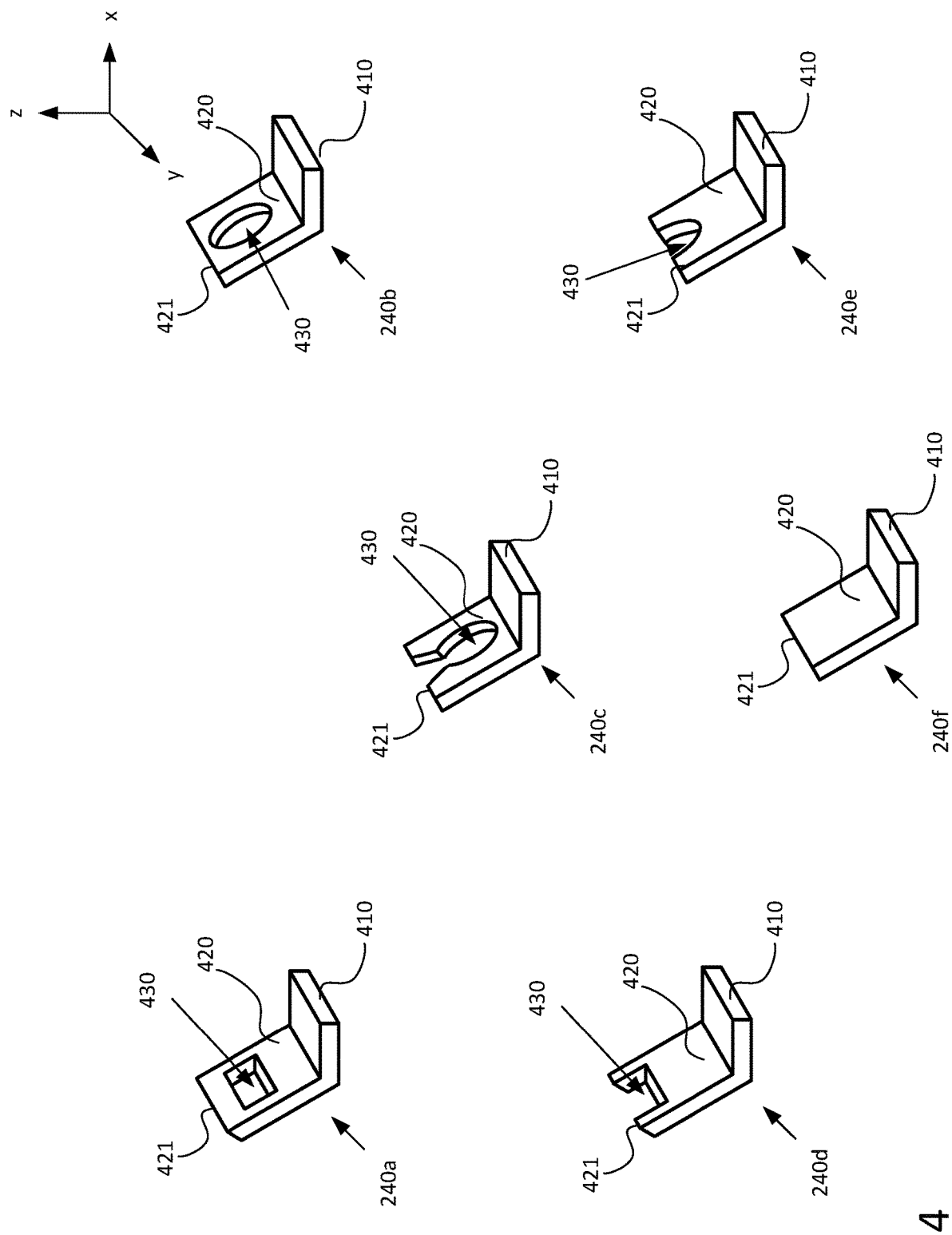
FIG. 4 illustrates several variations of inserts, as may be used to fully or partially occupy a slot in a frame lid assembly, according to embodiments of the present disclosure.

FIG. 4 illustrates several variations of inserts 240a-f (generally, insert 240), as may be used to fully or partially occupy a slot 230 in a frame lid assembly as described herein. Each of the inserts 240 include an insert foot 410, and an insert wall 420 that are set at a relative angle to each other equal to the relative angle of the foot 211 and the wall 213 that the insert 240 is to be bonded to. The insert 240 is inserted into the slot 230, and is bonded to the substrate 110 via the adhesive 130, and to the foot 211 and the wall 213 via a sealant or another adhesive. Once inserted into the slot 230, the insert 240 defines an opening of a smaller size than the slot 230 that the optical fibers 170 pass through. The opening is sealed by various sealants to provide a hermetically sealed cavity 220 and to secure the optical fibers 170 traversing the opening. In various embodiments, the sealant is cured during the same operation that cures the adhesive 130.

The opening is sized according to the shape, size, and number of the optical fibers 170 connected to the PIC 150 and may be defined internally to the insert wall 420 (e.g., as in inserts 240a and 240b) or may be defined between the insert wall 420 and the wall 213 of the first frame lid 210 (e.g., as in inserts 240c-f). In embodiments using an open cutout 430 (e.g., inserts 240c-e) or no cutout 430 (e.g., insert 240f), the size and shape of the opening is defined by a remaining open portion of the slot 230 between a distal end 421 of the insert wall 420 and the wall 213, and any portion of the insert wall 420 defining a cutout 430. In other embodiments with closed cutouts 430 (e.g., inserts 240a and 240b), the size and shape for the opening is defined by the size and shape of the cutout 430.

Figure 5A:
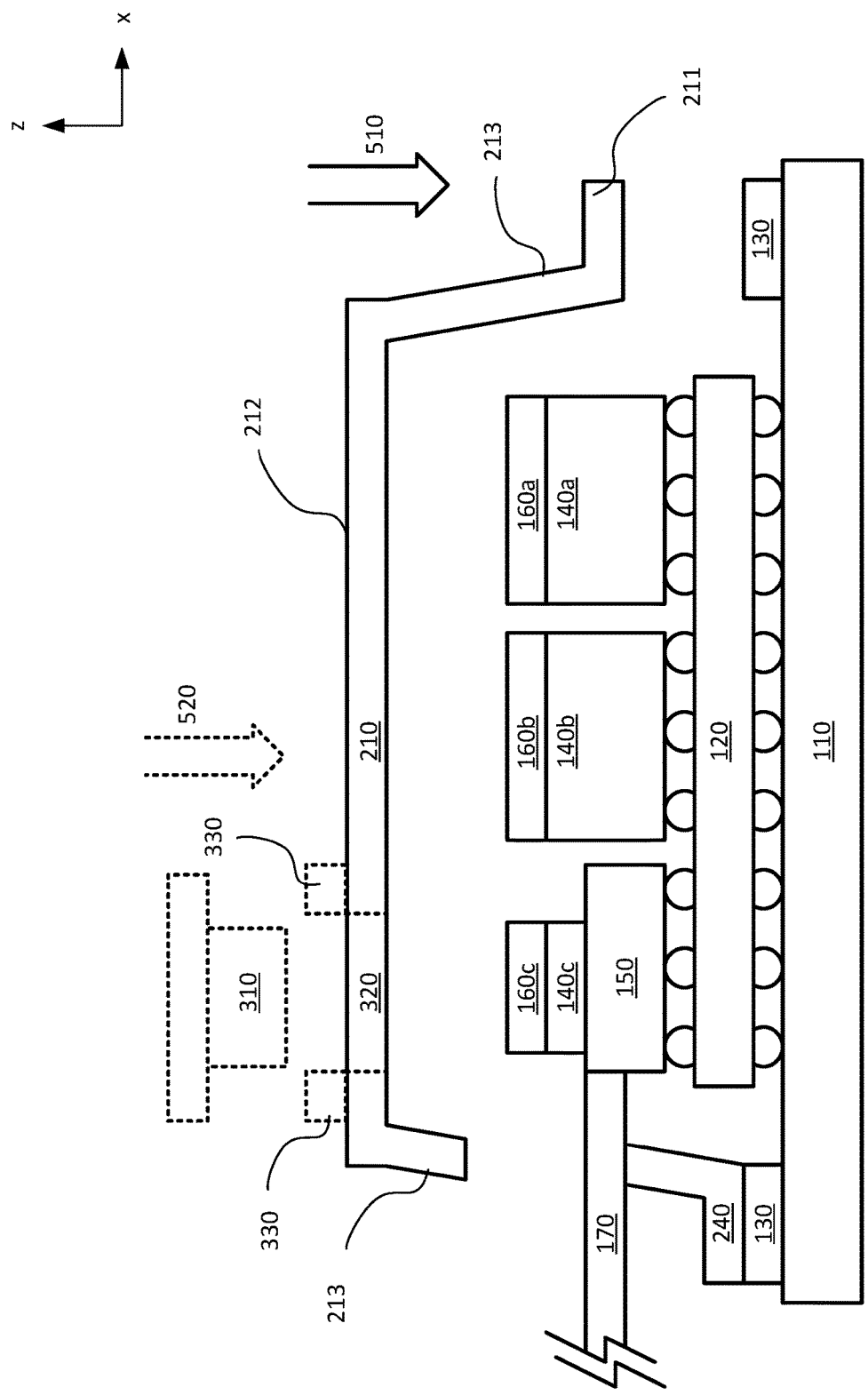
FIGS. 5A and 5B illustrate assembly of a photonic platform with a first frame lid and a pre-placed insert, according to embodiments of the present disclosure.
Figure 5B:
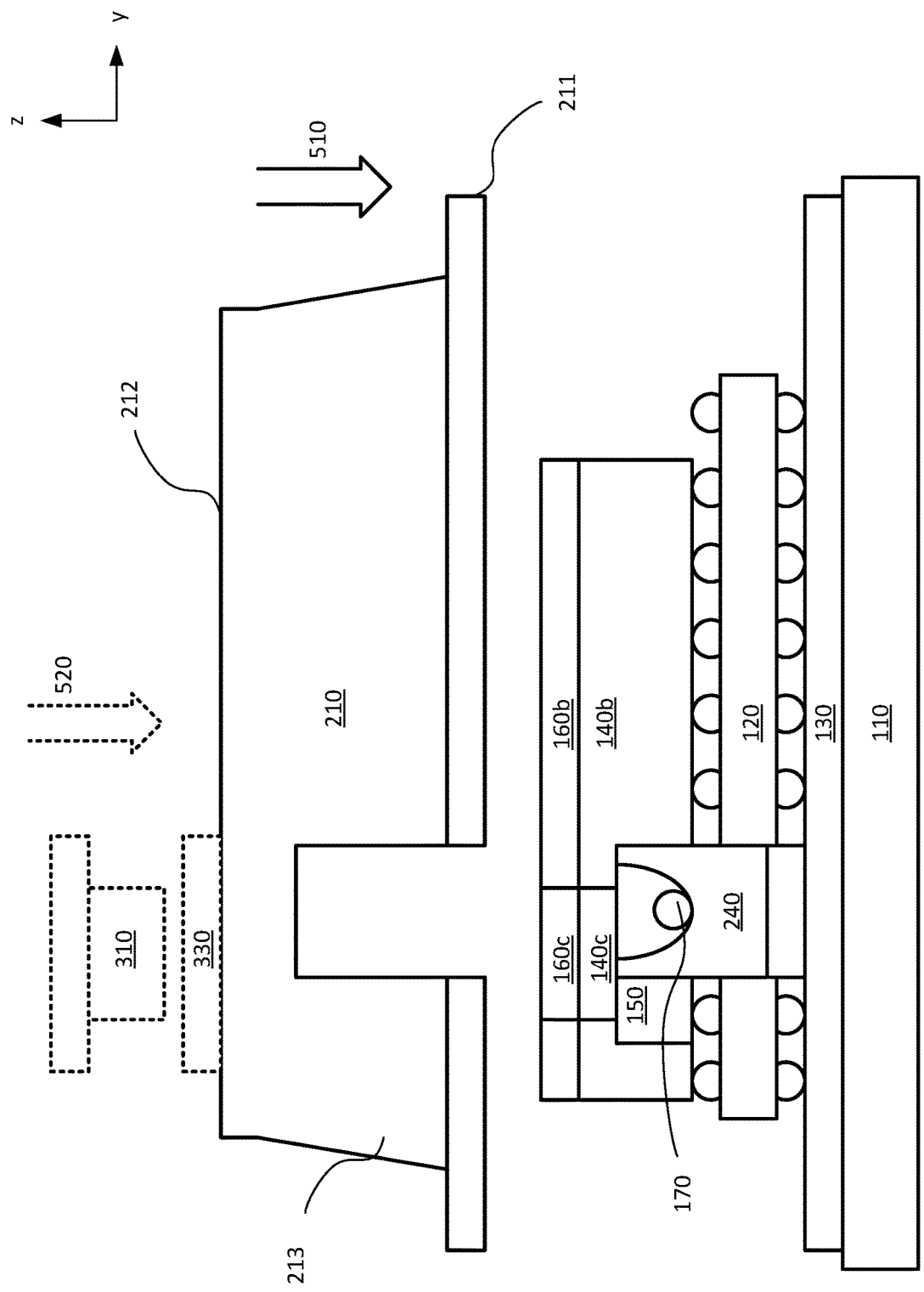

FIGS. 5A and 5B illustrate assembly of a photonic platform with a first frame lid 210 and a pre-placed insert 240, according to embodiments of the present disclosure. FIG. 5A shows a first cutaway view of the photonic platform and FIG. 5B shows a second planar view of the photonic platform. In FIGS. 5A and 5B, the second frame lid 310 and thermal isolator 330 (and associated arrow 520) are shown as optional elements; the second frame lid 310 and thermal isolator 330 may be omitted, placed before placing the first frame lid 210, or placed after placing the first frame lid 210. When the first frame lid 210 defines a slot 230 through the wall 213 and the foot 211, the fabricator may place the first frame lid 210 over the optical assembly 100 (per Arrow 510). The insert 240 may be pre-positioned so that when the fabricator places the first frame lid 210, the slot 230 is placed around and in contact with the insert 240, and the optical fiber 170 is captured between the insert 240 and the first frame lid 210. After placing the first frame lid 210 over the optical assembly 100, in multi-lidded embodiments, the fabricator may then place the thermal isolator 330 and/or the second frame lid 310 (per Arrow 520).

Figure 6A:
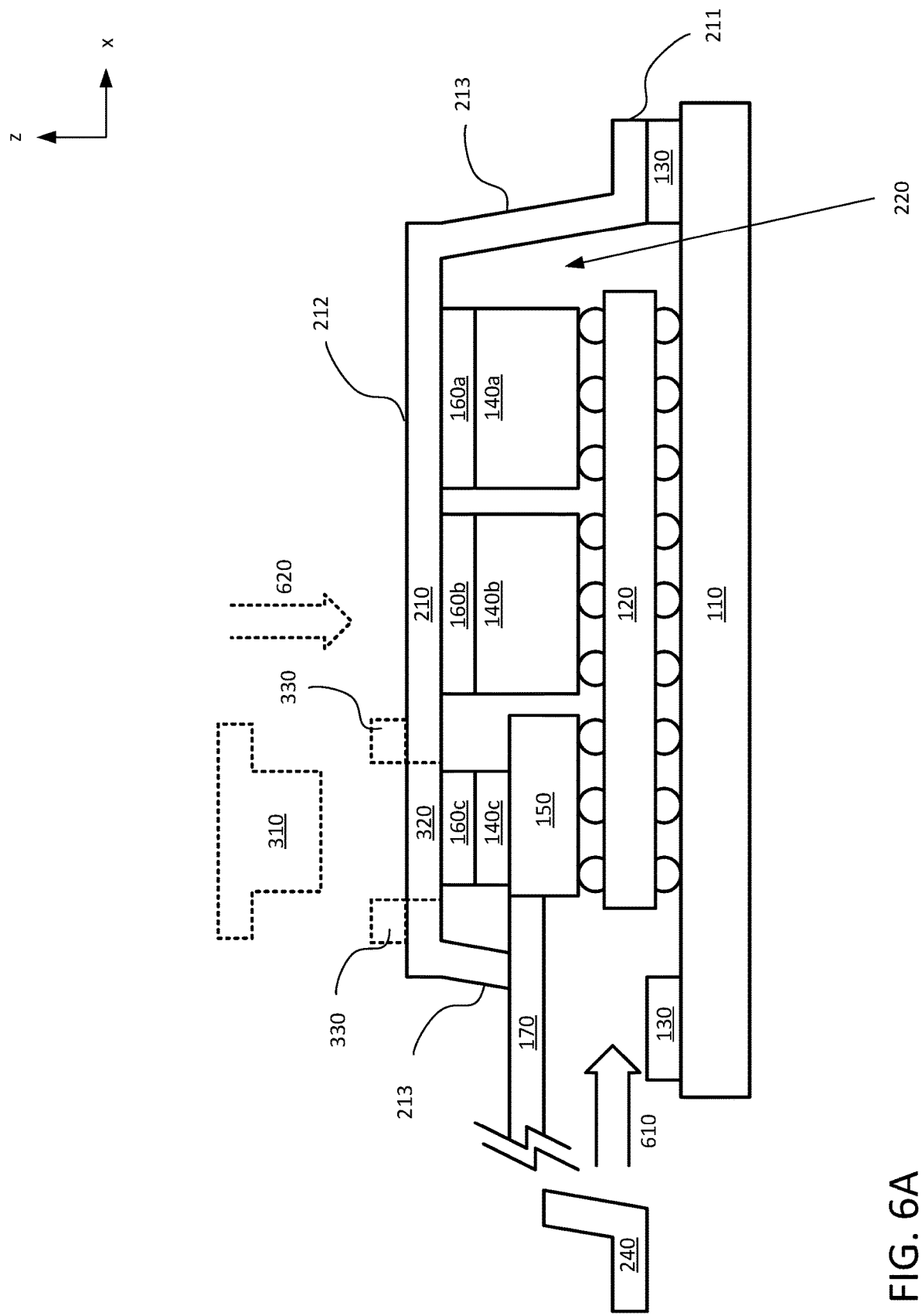
FIGS. 6A and 6B illustrate assembly of a photonic platform with a first frame lid and a subsequently-placed insert, according to embodiments of the present disclosure.
Figure 6B:
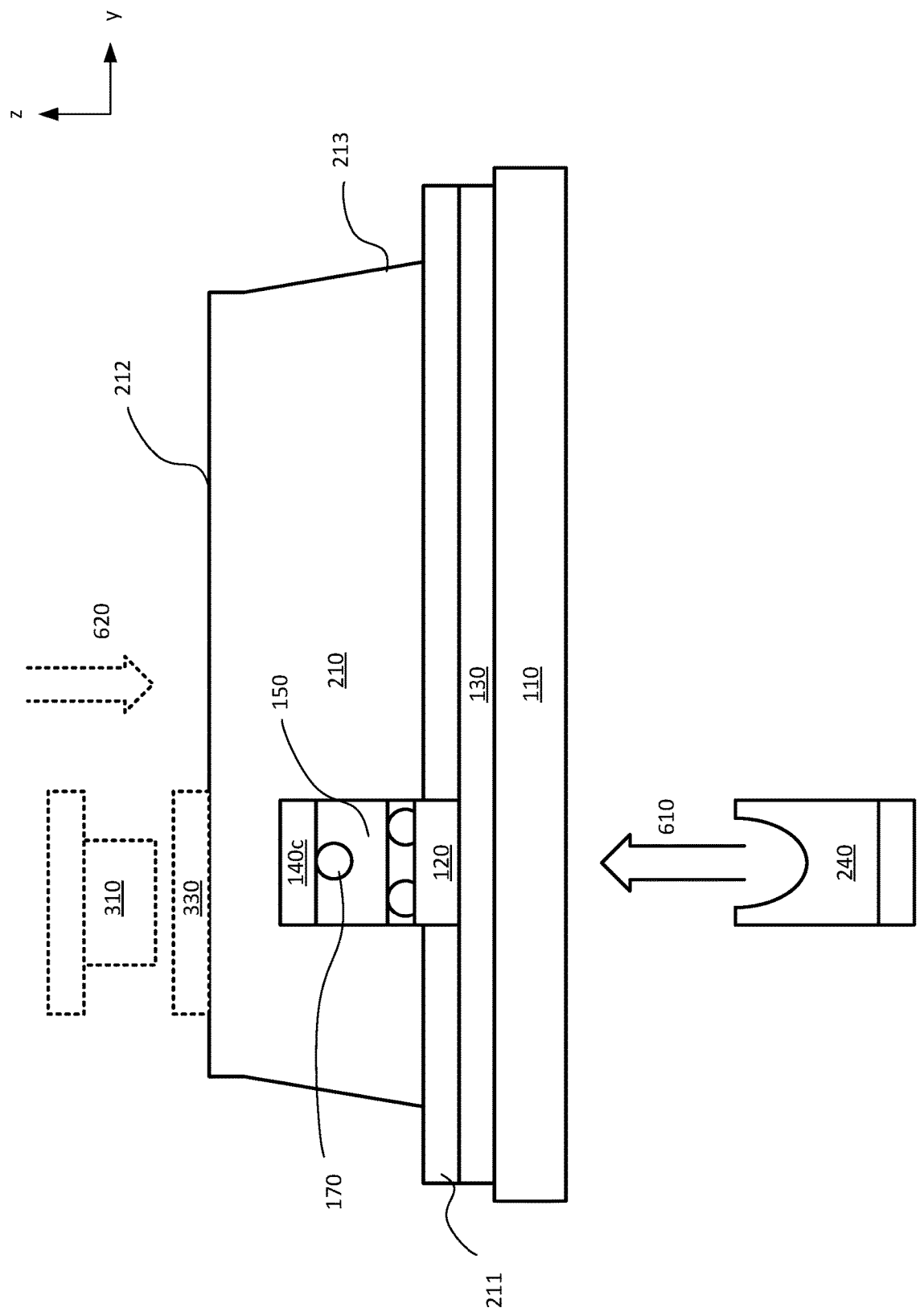

FIGS. 6A and 6B illustrate assembly of a photonic platform with a first frame lid 210 and a subsequently-placed insert 240, according to embodiments of the present disclosure. FIG. 6A shows a first cutaway view of the photonic platform and FIG. 6B shows a second planar view of the photonic platform. In FIGS. 6A and 6B, the second frame lid 310 and thermal isolator 330 (and associated arrow 620) are shown as optional elements; the second frame lid 310 and thermal isolator 330 may be omitted, placed before placing the first frame lid 210, or placed after placing the first frame lid 210. When the first frame lid 210 defines a slot 230 through the wall 213 and the foot 211, the fabricator may place the first frame lid 210 over the optical assembly 100. The fabricator may place the insert 240 into the slot 230 of the pre-positioned first frame lid 210 so that the insert 240 is placed "under" the optical fiber 170 and the first frame lid 210 and in contact with the adhesive 130 (per Arrow 610). The insert 240 and first frame lid 210 thus capture the optical fiber 170 between the insert 240 and the first frame lid 210. After placing the insert 240 into the slot 230, in multi-lidded embodiments, the fabricator may then place the thermal isolator 330 and/or the second frame lid 310 (per Arrow 620).

Figure 7A:
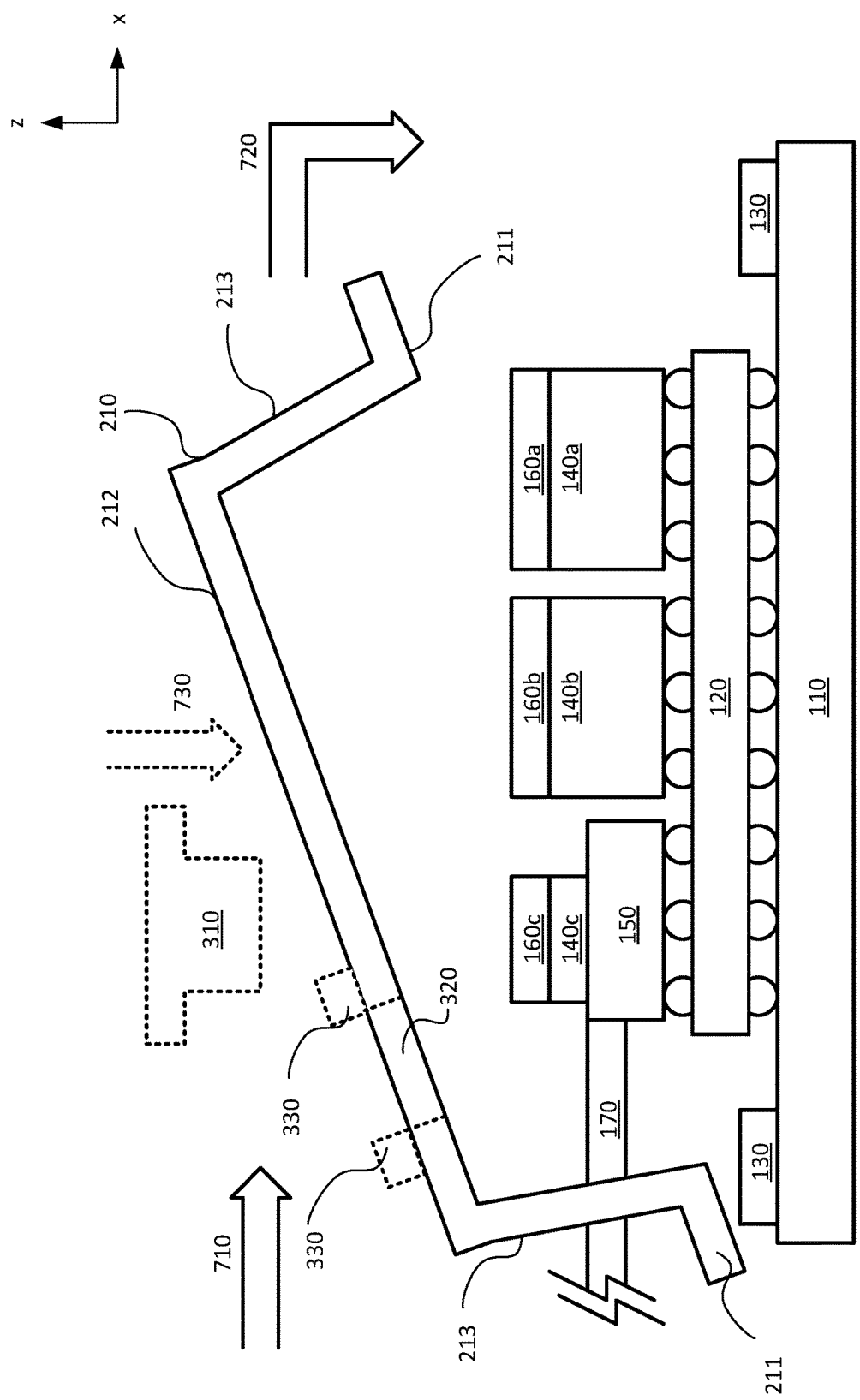
FIGS. 7A and 7B illustrate assembly of a photonic platform with a first frame lid defining a closed slot, according to embodiments of the present disclosure.
Figure 7B:
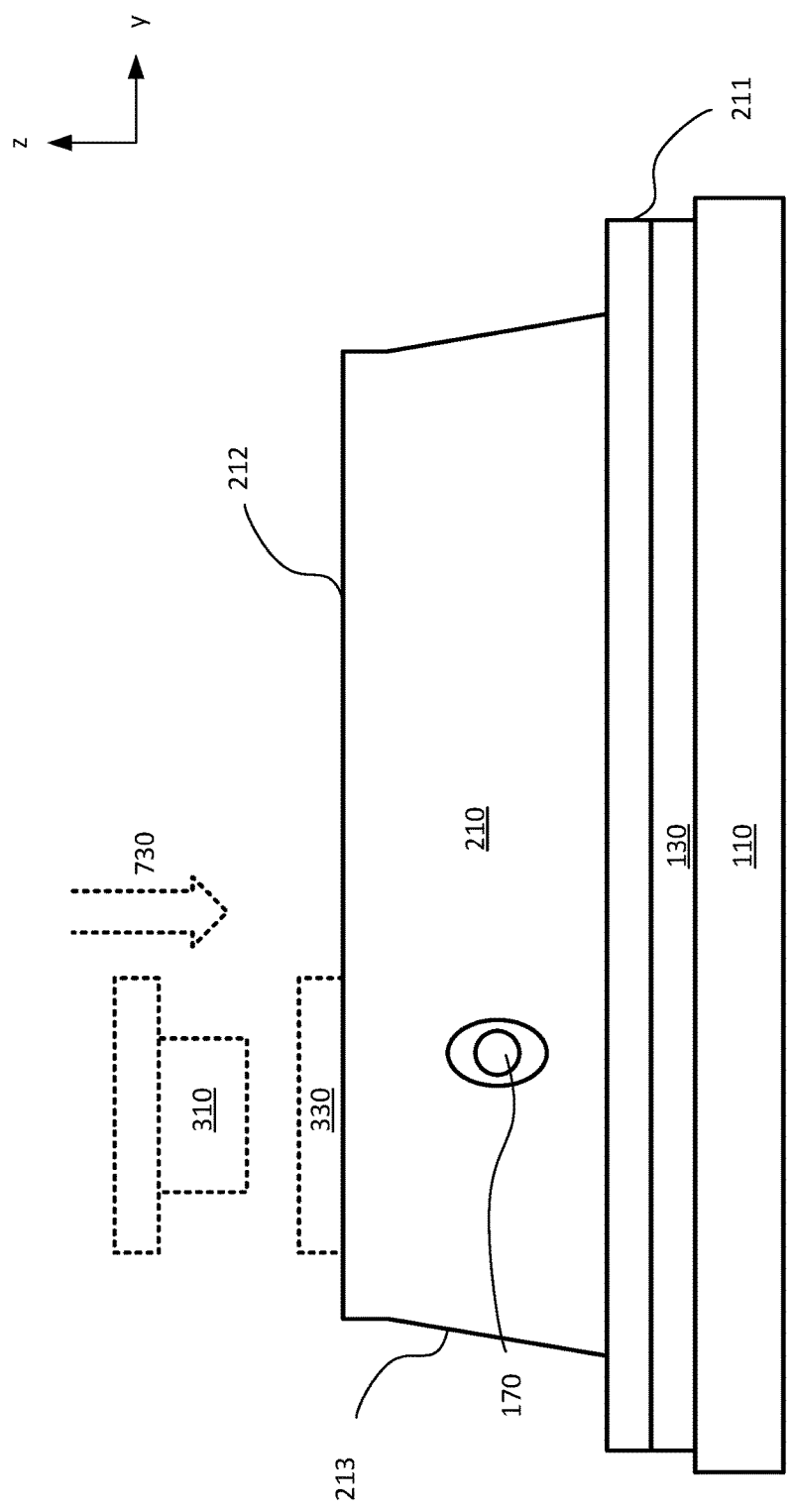

FIGS. 7A and 7B illustrate assembly of a photonic platform with a first frame lid 210 defining a closed slot 230, according to embodiments of the present disclosure. In embodiments using a closed slot 230, the fabricator inserts the optical fiber 170 through the slot 230, and slides the first frame lid 210 into position along the length of the optical fiber (per Arrow 710). Once in position over the optical assembly 100, the fabricator lowers the first frame lid 210 to place the foot 211 in contact with the adhesive 130 (per Arrow 720). In multi-lidded embodiments, the fabricator may then place the thermal isolator 330 and/or the second frame lid 310 (per Arrow 730). In FIGS. 7A and 7B, the second frame lid 310 and thermal isolator 330 (and associated arrow 730) are shown as optional elements; the second frame lid 310 and thermal isolator 330 may be omitted, placed before placing the first frame lid 210, or placed after placing the first frame lid 210.

Figure 8:
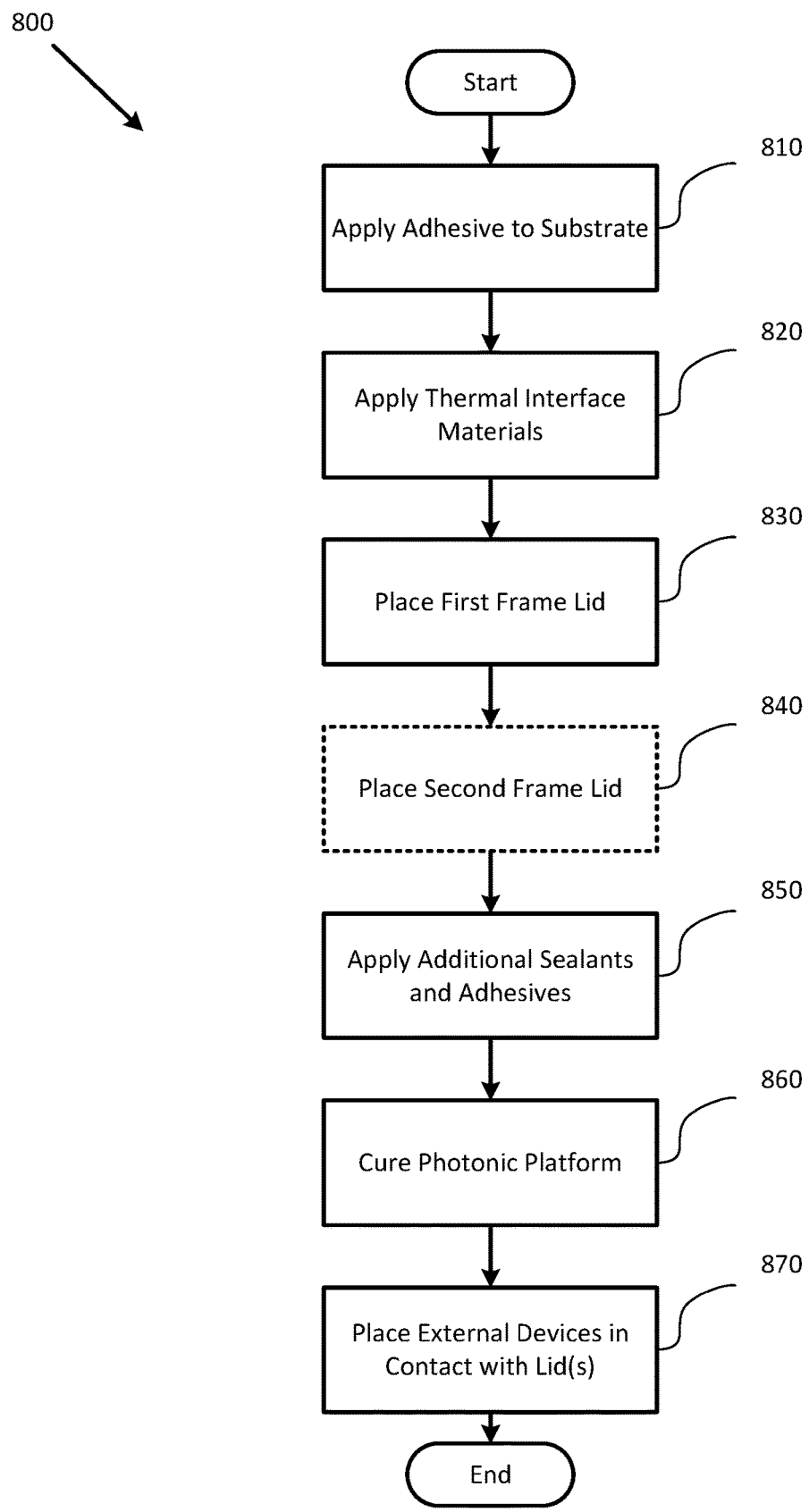
FIG. 8 is a flowchart of a method for attaching a frame assembly to an optical assembly, according to embodiments of the present disclosure.

FIG. 8 is a flowchart of a method 800 for attaching a frame assembly to an optical assembly 100. The optical assembly 100, such as the optical assembly discussed in relation to FIGS. 1A-1C includes a substrate 110, a first EIC 140a mounted to the substrate 110 (either directly or via an interposer 120), a PIC 150 mounted to the substrate 110 (directly or via an interposer 120) on a first side and to a second EIC 140b on an opposite side, and an optical fiber 170, connected to the PIC 150.

Method 800 begins at block 810, where a fabricator applies an adhesive 130 to the substrate 110 in a perimeter around the optical assembly 100. The adhesive 130 provides a thermally activated bond between the substrate 110 and the frame assembly that is airtight or watertight to hermetically seal the optical assembly 100 within the frame assembly.

At block 820, the fabricator applies a first TIM 160a to a first surface of the first EIC 140a, and a second TIM 160b to a second surface of the second EIC 140b. The TIM 160 are flowable materials that provide a thermally conductive surface between the EIC 140 of the optical assembly 100 and the frame lid assembly.

At block 830, the fabricator places a first frame lid 210 onto the optical assembly 100. Once placed, in one embodiment, a foot 211 of the first frame lid 210 contacts the adhesive 130, a roof 212 of the first frame lid 210 contacts the first TIM 160a, and the optical fiber 170 is disposed a slot 230 defined in a wall 213 of the first frame lid 210 that is nonparallel to the roof 212. In embodiments using a one-lidded design, the roof 212 is also in contact with the second TIM 160b, but in embodiments using a two-lidded design, the fabricator leaves the second TIM 160b exposed by a port 320 defined in the roof 212.

In embodiments in which the first frame lid 210 defines an open slot 230 through the foot 211 and the wall 213, the fabricator may vertically place the first frame lid 210 onto the adhesive 130 and over the optical assembly 100 (e.g., by lowering the first frame lid 210 into position). When using an insert 240, the fabricator places the insert 240 into the slot 230 in contact with the adhesive 130 and between the substrate 110 and the optical fiber 170. The insert 240 may be placed in the slot 230 and "under" the optical fiber 170 so that when the first frame lid 210 is placed onto the adhesive 130 and "over" the optical fiber 170, the optical fiber 170 is captured between the first frame lid 210 and the insert 240. The fabricator may put the insert 240 in place before or after placing the first frame lid 210.

In embodiments in which the first frame lid 210 defines a closed slot 230 through the wall 213, the fabricator inserts a distal end of the optical fiber 170 from the PIC 150 through the slot 230 and slides the first frame lid 210 along a length of the optical fiber 170 until the foot 211 is in contact with the adhesive 130. The fabricator may then adjust the position of the first frame lid 210.

At block 840, when using a multi-lidded design, the fabricator places a second frame lid 310 through the port 320 to contact the second TIM 160b. The second frame lid 310 is thermally isolated from the first frame lid by a thermal isolator 330. Method 800 may omit block 840 when using a one-lidded design. In some embodiments, the fabricator applies a thermal isolator 330 to the port 320, either around the perimeter of the port 320 outside of the cavity 220 or surrounding the lip of the roof 212 that defines the port 320 both inside and outside of the cavity 220. The thermal isolator 330 separates the second frame lid 310 from the first frame lid 210, and the fabricator may apply the thermal isolator 330 to roof 212 before placing the first frame lid 210 onto the optical assembly 100 or after placing the first frame lid 210 onto the optical assembly 100.

At block 850, the fabricator applies additional sealants or adhesives to the photonic platform at any designated joints. For example, the fabricator may apply sealants to joints between the foot 211 and wall 213 of the first frame lid 210 and any inserts 240 placed in slots 230 defined therein, and to the openings around the optical fibers 170 passing through the first frame lid 210, to the port 320 in which a second frame lid 310 is inserted (including to the thermal isolator 330).

At block 860, the fabricator cures the photonic platform at a designated temperature and pressure to hermetically seal the cavity 220 defined between the first frame lid 210 and the substrate 110. For example, a fabricator may cure the photonic platform at a temperature selected to be high enough to flow the TIM 160 and activate the adhesive 130 and any sealants, but low enough to not permanently affect the operational characteristics of the EIC 140 or PIC 150. The fabricator may select a pressure (e.g., low or medium vacuum) to evacuate air from the cavity 220, so that when the photonic platform is hermetically sealed, the cavity 220 maintains a low-pressure environment to reduce convective heat transfer between elements within the cavity 220. The fabricator cures the adhesive 130, the first TIM 160a, and the second TIM 160b to bond the first frame lid 210 onto the optical assembly 100. The fabricator also cures any applied sealant to seal the optical fiber 170 in the slot 230, secure the insert 240 (if included) in the slot 230, secure the thermal isolator 330 and the second frame lid 310 (if included) to the first frame lid 210, and seal the port 320 (if included).

At block 870, the fabricator places external devices on the lid(s) of the photonic platform. For example, the fabricator may place a first heatsink 340a on the first frame lid 210 and/or a second heatsink 340b on the second frame lid 310. In some embodiments, block 870 is performed before block 860 so that the external devices are bonded to the photonic platform during the curing process. In some embodiments, block 870 is performed after block 860, and the external devices may be secured to the photonic platform in a separate curing process or by mechanical clips that do not require a curing process. In other embodiments, the fabricator may omit block 870 if no external devices are to be bonded to the photonic platform. Method 800 may then conclude.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s). As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A platform, comprising:
   a substrate;
   a first Integrated Circuit (IC) mounted to the substrate at a first height relative to the substrate;
   a second IC mounted to the substrate at a second height, less than the first height, relative to the substrate;
   a first frame lid mounted to the substrate and defining a cavity with the substrate that encapsulates the first IC and the second IC, the first frame lid comprising:
      a first roof disposed in a first plane parallel to the substrate, the first roof defining a port providing access to the second IC through the first roof;
      a foot disposed in a second plane parallel to the first plane and connected to the substrate; and
      a wall, connecting the first roof to the foot; and
   a second frame lid mounted to the first roof via a thermal isolator and extending through the port to a third plane, parallel to the second plane to be in thermal contact with the second IC at the second height.

2. The platform of claim 1, wherein a slot defines an opening in the wall and the foot provides access to the cavity; and the platform further comprises:
   an insert, comprising: an insert foot, connected to the substrate at the opening; and an insert wall, connected to the wall at the opening, the insert wall and the wall defining the slot; and an optical fiber, connected through the slot to a photonic integrated circuit (PIC), mounted between the second IC and the substrate.

3. The platform of claim 1, wherein the first IC is connected to the first roof within the cavity via a first Thermal Interface Material; and
   wherein the second IC is connected within the cavity to the second frame lid via a second Thermal Interface Material.

4. The platform of claim 3, further comprising:
   a first heat sink connected to the first roof on a side opposite to the first Thermal Interface Material; and
   a second heat sink connected to the second frame lid on a side opposite to the second Thermal Interface Material.

5. The platform of claim 1, wherein the second frame lid is thermally isolated from the first frame lid via the thermal isolator, and wherein the thermal isolator extends into the cavity.

6. The platform of claim 1, wherein the cavity is hermetically sealed by curing an adhesive between the foot and the substrate and the thermal isolator.

7. A method for attaching a frame assembly to a circuit package comprising a substrate, a first Electronic Integrated Circuit (EIC) mounted to the substrate and a second EIC, the method comprising:
   applying an adhesive to the substrate;
   applying a first thermal interface material to a first surface of the first EIC;
   applying a second thermal interface material to a second surface of the second EIC;
   placing a first frame lid onto the circuit package, wherein a foot of the first frame lid contacts the adhesive, a roof of the first frame lid contacts the first thermal interface material, and the second thermal interface material is exposed by a port defined in the roof and placing the first frame lid onto the circuit package comprises:
      inserting an optical fiber through a slot defined in a wall of the first frame lid; and
      sliding the first frame lid along a length of the optical fiber until the foot is in contact with the adhesive;
   placing a second frame lid through the port to contact the second thermal interface material, wherein the second frame lid is thermally isolated from the first frame lid; and
   curing the adhesive, the first thermal interface material, and the second thermal interface material to bond the first frame lid and the second frame lid onto the circuit package and to seal the port.

8. The method of claim 7, further comprising:
   applying a thermal isolator to the port, wherein the thermal isolator separates the second frame lid from the first frame lid; and
   wherein curing further comprises curing the thermal isolator to bond the second frame lid to the first frame lid.

9. The method of claim 8, wherein the thermal isolator is applied to the roof prior to placing the first frame lid onto the circuit package.

10. The method of claim 7, wherein placing the first frame lid onto the circuit package comprises:
    placing an insert, in contact with the adhesive, between the substrate and an optical fiber in contact with a Photonic Integrated Circuit connected between the second EIC and the substrate; and
    placing the first frame lid onto the adhesive, such that the optical fiber is captured between the first frame lid and the insert.

11. The method of claim 10, wherein the insert is inserted prior to placing the first frame lid onto the adhesive.

12. The method of claim 10, wherein curing the adhesive bonds the insert with the first frame lid.

13. The method of claim 7, further comprising:
    bonding a first heatsink to the first frame lid; and
    bonding a second heatsink to the second frame lid.

14. A method for attaching a frame assembly to a circuit package comprising a substrate, a first Electronic Integrated Circuit (EIC) mounted to the substrate at a first height relative to the substrate and a second EIC mounted to the substrate at a second height, less than the first height, relative to the substrate, the method comprising:
    applying an adhesive to the substrate;
    applying a first thermal interface material to a first surface of the first EIC;
    applying a second thermal interface material to a second surface of the second EIC;
    placing a first frame lid onto the circuit package, wherein a foot of the first frame lid contacts the adhesive in a first plane parallel to the substrate, a roof of the first frame lid contacts the first thermal interface material in a second plane parallel to the first plane, and the second thermal interface material is exposed by a port defined in the roof;
    placing a second frame lid through the port to contact the second thermal interface material in a third plane parallel to the second plane, wherein the second frame lid is thermally isolated from the first frame lid; and
    curing the adhesive, the first thermal interface material, and the second thermal interface material to bond the first frame lid and the second frame lid onto the circuit package and to seal the port.

15. The method of claim 14, further comprising:
    applying a thermal isolator to the port, wherein the thermal isolator separates the second frame lid from the first frame lid; and
    wherein curing further comprises curing the thermal isolator to bond the second frame lid to the first frame lid.

16. The method of claim 15, wherein the thermal isolator is applied to the roof prior to placing the first frame lid onto the circuit package.

17. The method of claim 14, wherein placing the first frame lid onto the circuit package comprises:
   placing an insert, in contact with the adhesive, between the substrate and an optical fiber in contact with a Photonic Integrated Circuit connected between the second EIC and the substrate; and
   placing the first frame lid onto the adhesive, such that the optical fiber is captured between the first frame lid and the insert.

18. The method of claim 17, wherein the insert is inserted prior to placing the first frame lid onto the adhesive.

19. The method of claim 17, wherein curing the adhesive bonds the insert with the first frame lid.

20. The method of claim 14, further comprising:
   bonding a first heatsink to the first frame lid; and
   bonding a second heatsink to the second frame lid.

* * * * *